(12) United States Patent
Lee et al.

(10) Patent No.: US 11,450,681 B2
(45) Date of Patent: Sep. 20, 2022

(54) SEMICONDUCTOR DEVICE

(71) Applicant: SAMSUNG ELECTRONICS CO., LTD., Suwon-si (KR)

(72) Inventors: Haemin Lee, Seoul (KR); Jongwon Kim, Hwaseong-si (KR); Shinhwan Kang, Suwon-si (KR); Kohji Kanamori, Seongnam-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 16/844,234

(22) Filed: Apr. 9, 2020

(65) Prior Publication Data

US 2021/0035987 A1 Feb. 4, 2021

(30) Foreign Application Priority Data

Jul. 30, 2019 (KR) .......................... 10-2019-0092534

(51) Int. Cl.
*H01L 27/1157* (2017.01)
*H01L 27/11556* (2017.01)
(Continued)

(52) U.S. Cl.
CPC .... *H01L 27/1157* (2013.01); *H01L 27/11521* (2013.01); *H01L 27/11556* (2013.01); *H01L 27/11578* (2013.01)

(58) Field of Classification Search
CPC ......... H01L 27/11582; H01L 21/76805; H01L 21/76895; H01L 23/5283; H01L 23/535;
(Continued)

(56) References Cited

U.S. PATENT DOCUMENTS 8,008,722 B2  8/2011  Kim et al.
8,278,170 B2  10/2012 Lee et al.
(Continued)

FOREIGN PATENT DOCUMENTS

CN  107863351  3/2019
CN  108417577  3/2019
CN  108511358  3/2019

OTHER PUBLICATIONS

Office Action issued in corresponding German Patent Application No. 102020107651.7 dated Oct. 25, 2021.

*Primary Examiner* — Shahed Ahmed
*Assistant Examiner* — Khatib A Rahman
(74) *Attorney, Agent, or Firm* — F. Chau & Associates, LLC

(57) ABSTRACT

A semiconductor device includes a first stack group having first interlayer insulating layers and first gate layers, alternately and repeatedly stacked on a substrate and a second stack group comprising second interlayer insulating layers and second gate layers, alternately and repeatedly stacked on the first stack group. Separation structures pass through the first and second stack groups and include a first separation region and a second separation region. A vertical structure passes through the first and second stack groups and includes a first vertical region and a second vertical region. A conductive line is electrically connected to the vertical structure on the second stack group. A distance between an upper end of the first vertical region and an upper surface of the substrate is greater than a distance between an upper end of the first separation region and an upper surface of the substrate.

20 Claims, 18 Drawing Sheets

(51) Int. Cl.
*H01L 27/11521* (2017.01)
*H01L 27/11578* (2017.01)

(58) Field of Classification Search
CPC ......... H01L 27/11524; H01L 27/11556; H01L 27/1157; H01L 27/11519; H01L 27/11521; H01L 27/11578; H01L 27/11565; H01L 29/40117; H01L 29/732; H01L 21/76897; H01L 29/66666; H01L 29/7843; H01L 29/7846
See application file for complete search history.

(56) References Cited

U.S. PATENT DOCUMENTS

| | | | |
|---|---|---|---|
| 8,309,405 B2 * | 11/2012 | Yang | H01L 27/11582 438/156 |
| 8,847,302 B2 | 9/2014 | Alsmeier et al. | |
| 8,877,587 B2 * | 11/2014 | Noh | H01L 29/7926 438/268 |
| 9,159,426 B1 | 10/2015 | D'Abreu | |
| 9,343,476 B2 * | 5/2016 | Seo | H01L 27/11582 |
| 9,368,646 B2 * | 6/2016 | Kim | H01L 27/11582 |
| 9,570,463 B1 * | 2/2017 | Zhang | H01L 27/11575 |
| 9,634,022 B2 * | 4/2017 | Lee | H01L 29/7926 |
| 9,698,153 B2 | 7/2017 | Liu et al. | |
| 9,806,093 B2 | 10/2017 | Toyama et al. | |
| 9,853,043 B2 | 12/2017 | Lu et al. | |
| 9,991,280 B2 | 6/2018 | Nakamura et al. | |
| 10,269,435 B1 | 4/2019 | Chen et al. | |
| 2010/0109072 A1 | 5/2010 | Kidoh et al. | |
| 2010/0155810 A1 * | 6/2010 | Kim | H01L 29/792 257/316 |
| 2010/0176440 A1 | 7/2010 | Omura | |
| 2010/0224962 A1 * | 9/2010 | Kim | H01L 23/5228 257/536 |
| 2012/0003800 A1 * | 1/2012 | Lee | H01L 27/11578 438/261 |
| 2015/0145015 A1 * | 5/2015 | Shin | H01L 27/11531 257/314 |
| 2015/0236038 A1 | 8/2015 | Pachamuthu et al. | |
| 2016/0043100 A1 * | 2/2016 | Lee | H01L 27/11565 257/324 |
| 2016/0204117 A1 * | 7/2016 | Liu | H01L 27/11551 257/324 |
| 2016/0293627 A1 * | 10/2016 | Kim | H01L 27/11582 |
| 2017/0345843 A1 | 11/2017 | Lee et al. | |
| 2018/0226426 B2 | 8/2018 | Purayath | |
| 2019/0221558 A1 | 7/2019 | Chen et al. | |

* cited by examiner

SEMICONDUCTOR DEVICE

CROSS-REFERENCE TO RELATED APPLICATION

This application claims priority under 35 U.S.C. § 119 to Korean Patent Application No. 10-2019-0092534, filed on Jul. 30, 2019 in the Korean intellectual Property Office, the disclosure of which is incorporated by reference in its entirety herein.

TECHNICAL FIELD

The present inventive concepts relate to a semiconductor device, and more particularly to a semiconductor device having gate layers, a vertical structure, and separation structures in multiple stacks, and a method of forming the same.

DISCUSSION OF RELATED ART

There is a high level of interest concerning increasing the degree of integration of semiconductor devices to improve the price competitiveness of electronic devices. Semiconductor devices having three-dimensional memory cells have been developed which provide an increased degree of integration as compared to two-dimensional semiconductor devices.

SUMMARY

An aspect of the present inventive concepts is to provide a semiconductor device and a method of forming the same that improves the degree of integration of the semiconductor device.

According to an exemplary embodiment of the present inventive concepts, a semiconductor device includes a first stack group comprising first interlayer insulating layers and first gate layers, alternately and repeatedly stacked on a substrate. A second stack group comprising second interlayer insulating layers and second gate layers, alternately and repeatedly stacked on the first stack group. Separation structures pass through the first and second stack groups and are spaced apart from each other in a first direction that is parallel to an upper surface of the substrate. Each of the separation structures includes a first separation region and a second separation region disposed on the first separation region in a second direction that is a thickness direction of the substrate. A vertical structure passes through the first and second stack groups and is disposed between the separation structures in the first direction. The vertical structure includes a first vertical region and a second vertical region disposed on the first vertical region in the second direction. A conductive line is electrically connected to the vertical structure on the second stack group. The first vertical region comprises a first upper vertical region adjacent to the second vertical region and a first lower vertical region adjacent to the substrate. The second vertical region comprises a second lower vertical region adjacent to the first vertical region and having a width that is smaller than a width of the first upper vertical region, and a second upper vertical region adjacent to the conductive line. The first separation region comprises a first upper separation region adjacent to the second separation region, and a first lower separation region adjacent to the substrate. The second separation region comprises a second lower separation region adjacent to the first separation region and having a width that is smaller than a width of the first upper separation region, and a second upper separation region adjacent to the conductive line. A distance between an upper end of the first vertical region and an upper surface of the substrate is greater than a distance between an upper end of the first separation region and an upper surface of the substrate.

According to an exemplary embodiment of the present inventive concepts, a semiconductor device includes a substrate. First gate layers are stacked on an upper surface of the substrate and are spaced apart from each other in a vertical direction that is perpendicular to the upper surface of the substrate. An intermediate interlayer insulating layer is disposed on a first uppermost gate layer that is disposed in an uppermost position among the first gate layers. Second gate layers are stacked on the intermediate interlayer insulating layer and are spaced apart from each other in the vertical direction. A vertical structure passes through the first gate layers, the intermediate interlayer insulating layer, and the second gate layers. A separation structure passes through the first gate layers, the intermediate interlayer insulating layer, and the second gate layers. The vertical structure has a first bend portion extending from a portion passing through the intermediate interlayer insulating layer to an upper surface of the intermediate interlayer insulating layer. The separation structure has a second bend portion extending from a portion passing through the intermediate interlayer insulating layer to a lower surface of the intermediate interlayer insulating layer.

According to an exemplary embodiment of the present inventive concepts, a semiconductor device includes a substrate. A first stack group includes first interlayer insulating layers and first gate layers that are alternately and repeatedly stacked on the substrate. The first stack group includes a first uppermost interlayer insulating layer that is disposed in an uppermost position among the first interlayer insulating, layers. A second stack group includes a second interlayer insulating layers and second gate layers that are alternately and repeatedly stacked on the first stack group. The second stack group includes a second lowermost interlayer insulating layer that is disposed in a lowermost position among the second interlayer insulating layers. A vertical structure passes through the first and second stack groups in a vertical direction that is perpendicular to an upper surface of the substrate. Separation structures pass through the first and second stack groups in the vertical direction. The vertical structure has a first lower bend portion adjacent to the first uppermost interlayer insulating layer, and a first upper bend portion adjacent to the second lowermost interlayer insulating layer. The separation structures have a second bend portion adjacent to the first uppermost interlayer insulating layer. The second bend portion is disposed lower than each of the first lower and upper bend portions.

According to an exemplary embodiment of the present inventive concepts, a semiconductor device includes a substrate. A first stack group includes first interlayer insulating layers and first gate layers that are alternately and repeatedly stacked on the substrate. The first stack group includes a first uppermost interlayer insulating layer that is disposed in an uppermost position among the first interlayer insulating layers. A second stack group includes second interlayer insulating layers and second gate layers that are alternately and repeatedly stacked on the first stack group. The second stack group includes a second lowermost interlayer insulating layer that is disposed in a lowermost position among the second interlayer insulating layers. A vertical structure passes through the first and second stack groups in a vertical direction that is perpendicular to an upper surface of the substrate. The vertical structure has a first vertical region and a second vertical region disposed on the first vertical region. The first vertical region and second vertical region have first lateral side surfaces that are aligned with each other in the vertical direction and second lateral side surfaces that are not aligned with each other in the vertical direction. Separation structures pass through the first, and second stack groups in the vertical direction. The vertical structure has a first bend portion on the second lateral side surfaces. The first bend portion is adjacent to the second lowermost interlayer insulating layer. The separation structures have a second bend portion adjacent to the first uppermost interlayer insulating layer and disposed at a lower level than the first bend portion.

BRIEF DESCRIPTION OF THE DRAWINGS

The above and other aspects, features, and advantages of exemplary embodiments of the present inventive concepts will be more clearly understood from the following detailed description, taken in conjunction with the accompanying drawings, in which.

DETAILED DESCRIPTION OF EXEMPLARY EMBODIMENTS

Hereinafter, exemplary embodiments of the present inventive concepts will be described with reference to the accompanying drawings.

Figure 1:
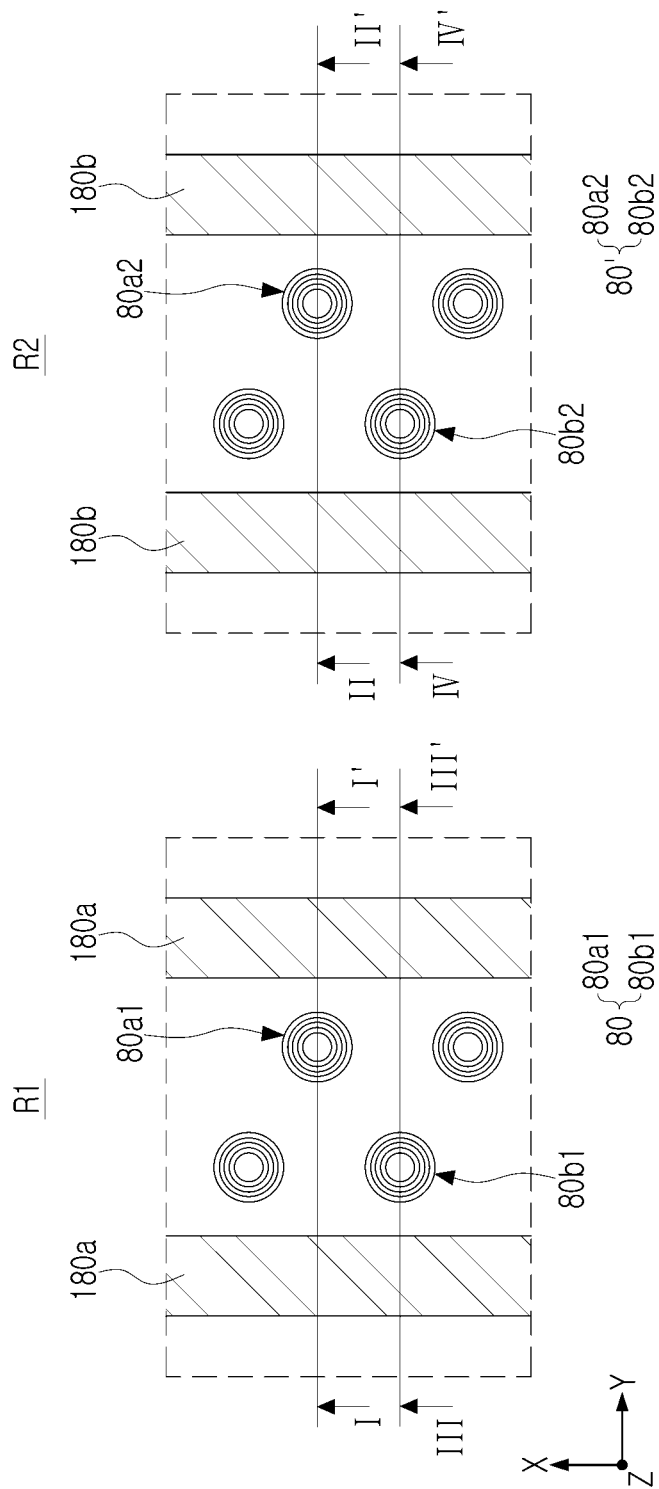
FIG. 1 is a top plan view of a semiconductor device according to an exemplary embodiment of the present inventive concepts.
Figure 2A:
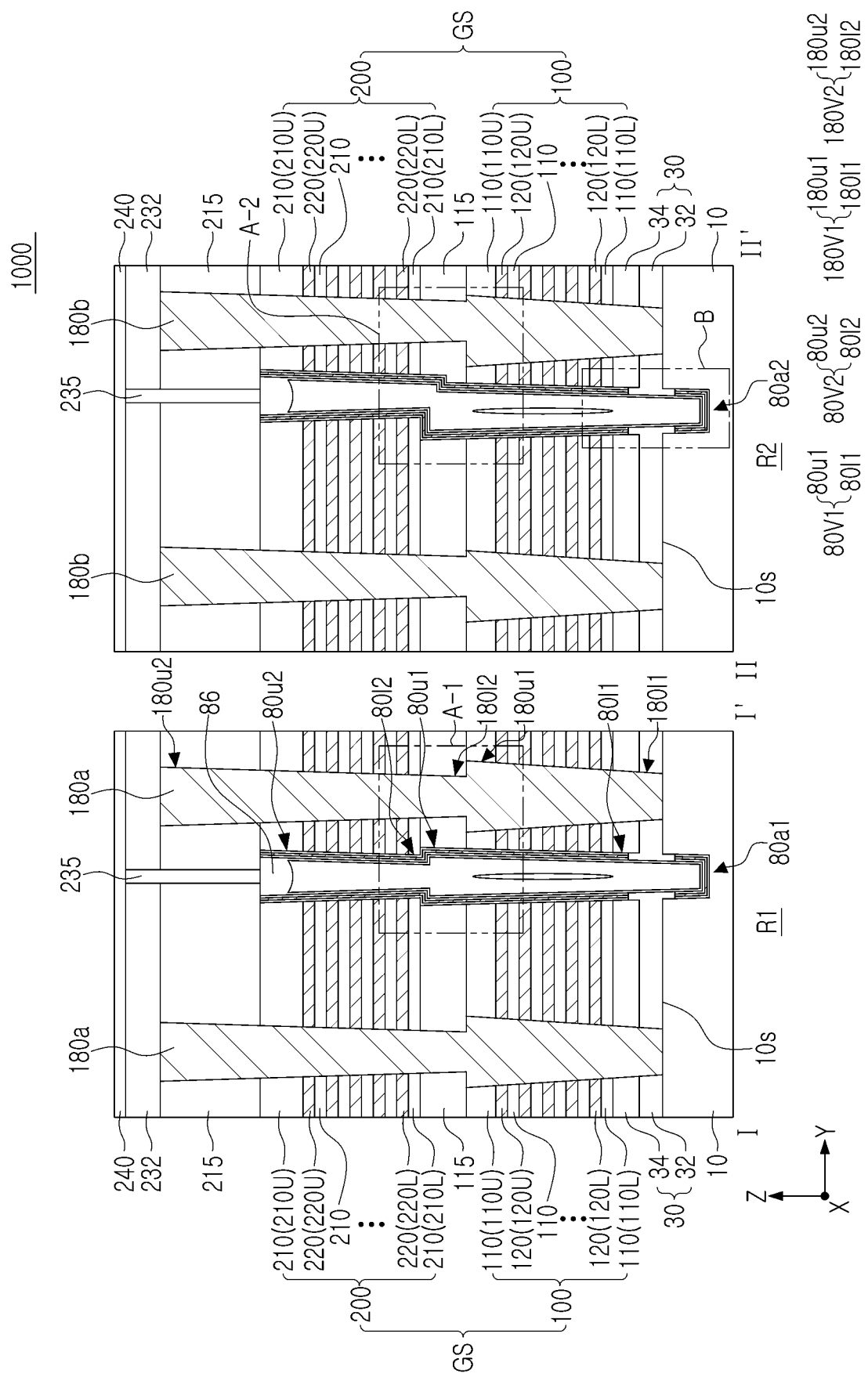
FIGS. 2A and 2B are cross-sectional views of a semiconductor device taken along lines I-I', II-II' and III-III', IV-IV' of FIG. 1, respectively, according to exemplary embodiments of the present inventive concepts.
Figure 2B:
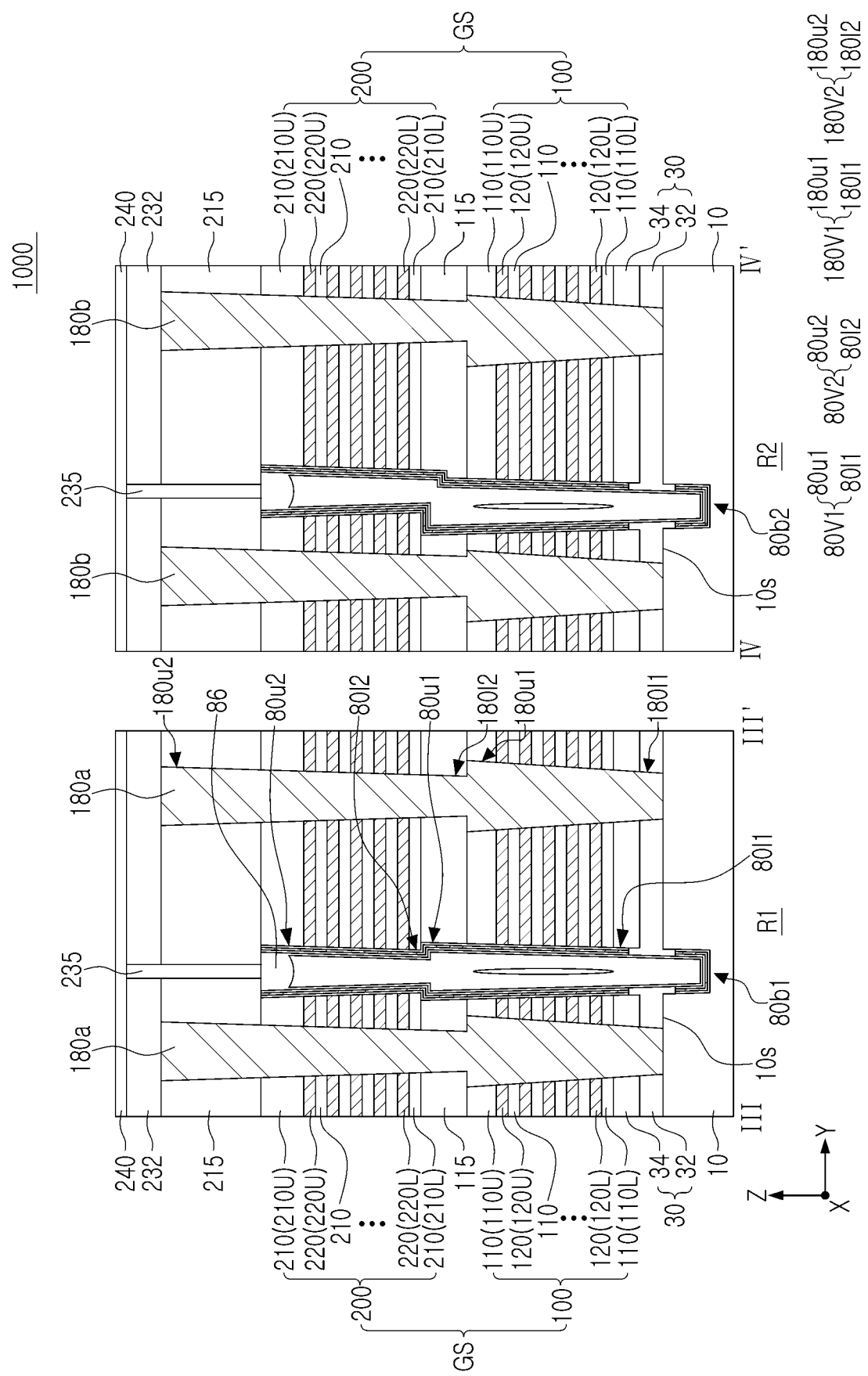
Figure 2C:
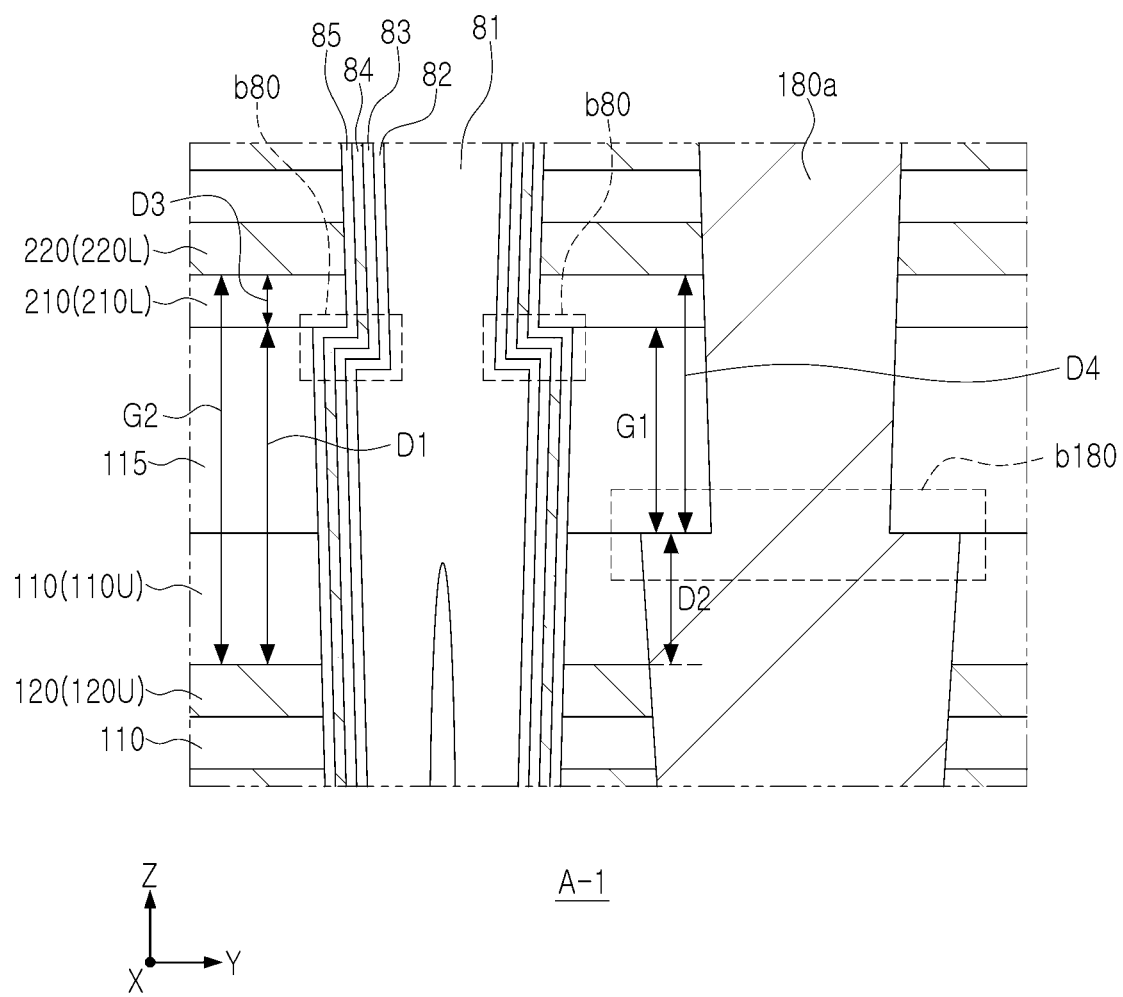
FIGS. 2C to 2E are enlarged partial crass-sectional, views of portion A-1, A-2 and B, respectively, of FIG. 2A according to exemplary embodiments of the present inventive concepts.
Figure 2D:
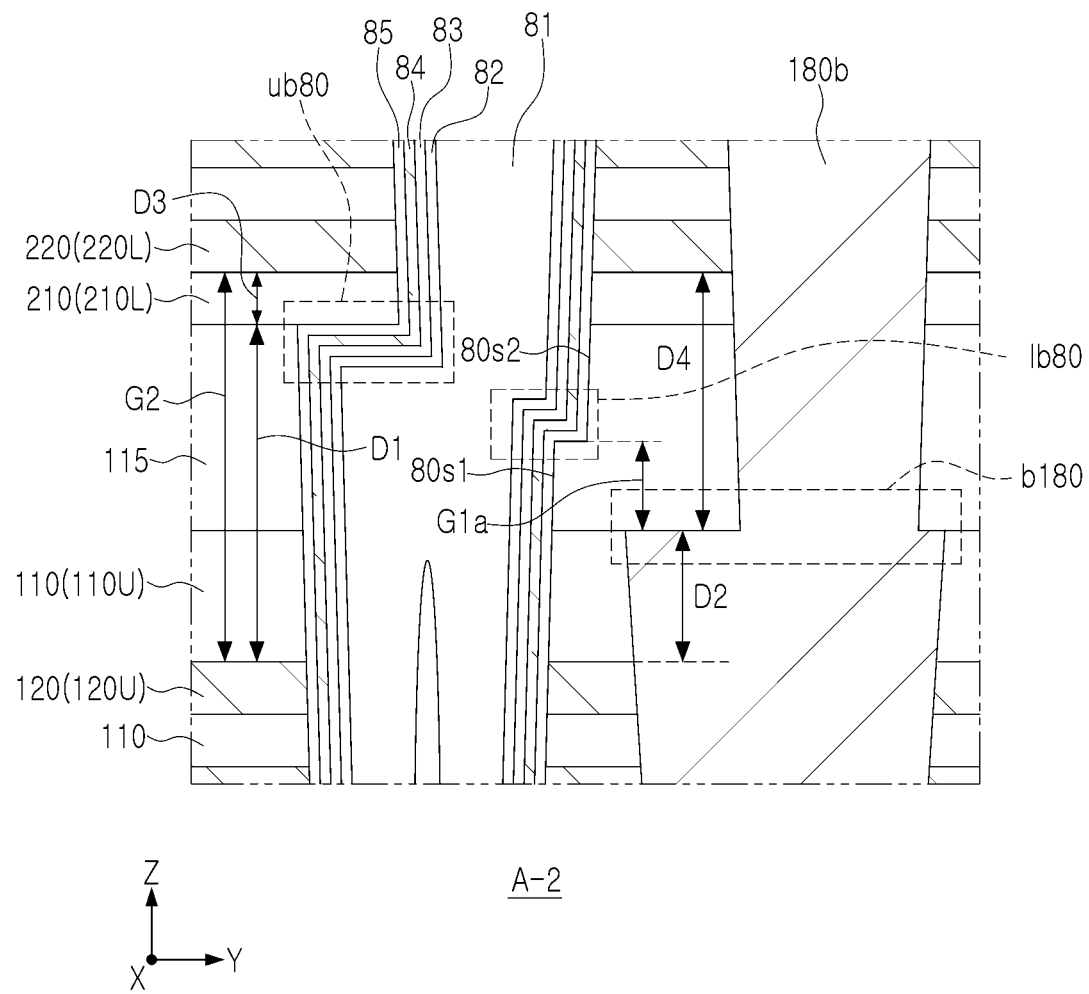
Figure 2E:
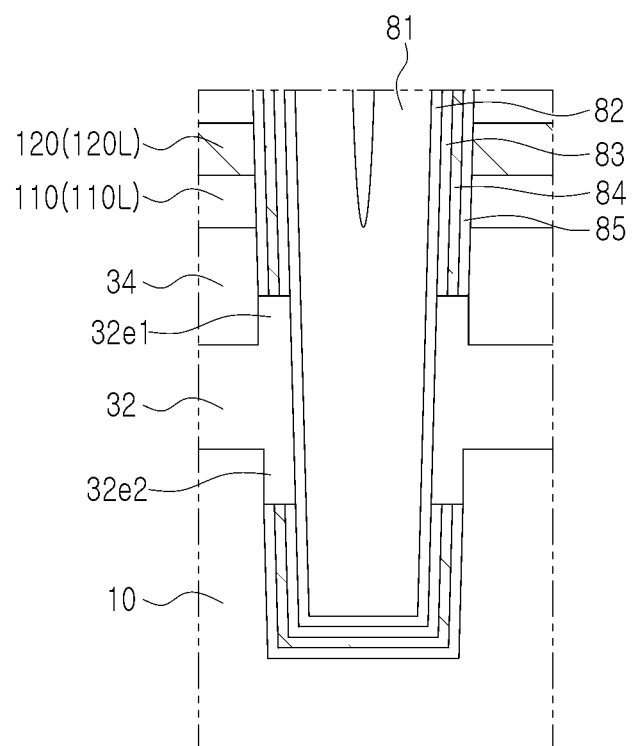

A semiconductor device according to an exemplary embodiment of the present inventive concepts will be described with reference to FIGS. 1 and 2A to 2E. FIG. 1 is a top plan view of a semiconductor device according to an exemplary embodiment of the present inventive concepts. FIG. 2A is cross-sectional views of a semiconductor device taken along lines I-I' and II-II' of FIG. 1, respectively, according to an exemplary embodiment of the present inventive concepts. FIG. 2B is cross-sectional views of a semiconductor device taken along lines III-III' and IV-IV' of FIG. 1, respectively, according to an exemplary embodiment of the present inventive concepts. FIG. 2C is an enlarged view of portion A-1 of FIG. 2A according to an exemplary embodiment of the present inventive concepts. FIG. 2D is an enlarged view of portion A-2 of FIG. 2A according to an exemplary embodiment of the present inventive concepts. FIG. 2E is an enlarged view of portion B of FIG. 2A according to an exemplary embodiment of the present inventive concepts.

Referring to FIGS. 1, and 2A to 2E, a semiconductor device 1000 according to an exemplary embodiment of the present inventive concepts may include a substrate 10, a horizontal connection pattern 30, a stacked structure GS, a plurality of vertical structures 80 and 80', a plurality of separation structures 180, and a conductive line 240.

In an exemplary, the semiconductor device 1000 may include at least one region selected from a first region R1 and a second region R2 on the substrate 10. For example, the semiconductor device 1000 may include either of the first region R1 or the second region R2, or both the first region R1 and the second region R2.

In an exemplary embodiment, the first region R1 may be a region in which an upper portion and a lower portion of the stacked structure GS are aligned (e.g., in the Z direction) and the second region R2 may be a region in which an upper portion and a lower portion of the stacked structure GS are not aligned (e.g., in the Z direction). First vertical structures 80 and first separation structures 180a may be arranged in the first region R1, and second vertical structures 80' and second separation structures 180b may be arranged in the second region R2. For example, as shown in the exemplary embodiment of FIG. 1, four first vertical structures 80 spaced apart in the X direction and/or Y direction and two first separation structures 180a spaced apart in the Y direction may be arranged in the first region R1 and four second vertical structures 80' are spaced apart in the X direction and/or Y direction and two second separation structures 180b spaced apart in the Y direction may be arranged in the second region R2. However, exemplary embodiments of the present inventive concepts are not limited thereto. In an exemplary embodiment, the first and second vertical structures 80 and 80' may be arranged to form a grid pattern or be arranged in a zigzag form in one direction. A detailed description of the first and second regions R1 and R2 will be described later.

The substrate 10 may have an upper surface 10s extending in the X and Y directions. In an exemplary embodiment, the substrate 10 may include a semiconductor material, such as a Group IV semiconductor or a Group III-V compound semiconductor. For example, the Group IV semiconductor may include at least one compound selected from silicon, germanium or silicon-germanium. The substrate 10 may be provided as a polycrystalline silicon layer or an epitaxial layer. The X direction and the Y direction may be parallel to the upper surface 10s of the substrate 10. The X and Y directions may be perpendicular to each other.

The stacked structure GS may be disposed on the substrate 10. The stacked structure GS may include a first stack group 100 on the substrate 10, and a second stack group 200 on the first stack group 100. The first stack group 100 and the second stack group 200 may be arranged in the Z direction. However, exemplary embodiments of the present inventive concepts are not limited thereto. For example, in other exemplary embodiments, the stacked structure GS may include three or more stack groups.

The stacked structure GS may include interlayer insulating layers and gate layers, alternately and repeatedly stacked. For example, as shown in the exemplary embodiment of FIG. 2A, the first stack group 100 may include first interlayer insulating layers 110 and first gate layers 120, alternately and repeatedly stacked (e.g., in the Z direction), and the second stack group 200 may include second interlayer insulating layers 210 and second gate layers 220, alternately and repeatedly stacked (e.g., in the Z direction). The first and second gate layers 120 and 220 may be substantially parallel to the upper surface 10s of the substrate 10. For example, as shown in the exemplary embodiment of FIG. 2A, the first and second gate layers 120 and 220 may extend in the Y direction. The first stack group 100 may include a first uppermost gate layer 120U disposed in an uppermost position (e.g., in the Z direction), and a first lowermost gate layer 120L disposed in a lowermost position (e.g., in the Z direction), among the first gate layers 120. The first stack group 100 may also include a first uppermost interlayer insulating layer 110U disposed in an uppermost position (e.g., in the Z direction), and a first lowermost interlayer insulating layer 110L disposed in a lowermost position (e.g., in the Z direction), among the first interlayer insulating layers 110.

The second stack group 200 may include a second uppermost gate layer 220U disposed in an uppermost position (e.g., in the Z direction), and a second lowermost gate layer 220L disposed in a lowermost position (e.g., in the Z direction), among the second gate layers 220. The second stack group 200 may also include a second uppermost interlayer insulating layer 210U disposed in an uppermost position (e.g., in the Z direction), and a second lowermost interlayer insulating layer 210L disposed in a lowermost position (e.g., in the Z direction), among the second interlayer insulating layers 210.

The semiconductor device 1000 may further include an intermediate interlayer insulating layer 115 disposed between the first stack group 100 and the second stack group 200 (e.g., in the Z direction). The intermediate interlayer insulating layer 115 may be interposed between the first uppermost interlayer insulating layer 110U and the second lowermost interlayer insulating layer 210L, and may be disposed to extend in the X direction and/or the Y direction. In an exemplary embodiment, the intermediate interlayer insulating layer 115 may be a layer distinguishing multiple stacks of a three-dimensional semiconductor device. However, exemplary embodiments of the present inventive concepts are not limited thereto. As shown in the exemplary embodiment of FIG. 2A, a bottom surface of the intermediate interlayer insulating layer 115 may be in contact with a top surface of the first uppermost interlayer insulating layer 110U, and a top surface of the intermediate interlayer insulating layer 115 may be in contact with a bottom surface of the second lowermost interlayer insulating layer 210L.

The first gate layers 120 may be stacked on the substrate 10 and are spaced apart: from each other in the Z direction. The second gate layers 220 may be stacked on the intermediate interlayer insulating layer 115 and are spaced apart from each other in the Z direction. The first and second gate layers 120 and 220 may be arranged to extend in the Y direction. The Z direction may be a direction, perpendicular to the upper surface 10s of the substrate 10 (e.g., a thickness direction of the substrate).

In an exemplary embodiment, the first and second gate layers 120 and 220 may include a conductive material layer. For example, the first and second gate layers 120 and 220 may include a metallic material such as tungsten (W). However, exemplary embodiments of the present inventive concepts are not limited thereto. In an exemplary embodiment, the first and second gate layers 120 and 220 may include a polycrystalline silicon material or a metal silicide material. In exemplary embodiments, the first and second gate layers 120 and 220 may further include a diffusion barrier. For example, in an exemplary embodiment, the diffusion barrier may include at least one material selected from tungsten nitride (WN), tantalum nitride (TaN), titanium nitride (TiN), or combinations thereof. According to an exemplary embodiment of the present inventive concepts, each of the first and second gate layers 120 and 220 may include the conductive material layer, and a dielectric layer covering upper and lower surfaces of the conductive material layer and extending between the vertical structure 80 and the conductive material layer. In the first and second gate layers 120 and 220, a portion formed of a conductive material may be a gate electrode. Therefore, the first, and second gate layers 120 and 220 may be referred to as gate electrodes.

The first interlayer insulating layers 110 may be disposed between the first gate layers 120 (e.g., in the Z direction), and the second interlayer insulating layers 210 may be disposed between the second gate layers 220 (e.g., in the Z direction). The first and second interlayer insulating layers 110 and 210 may be arranged to be spaced apart from each other in the Z direction, and extend in the Y direction.

In an exemplary embodiment, the first and second interlayer insulating layers 110 and 210 and the intermediate interlayer insulating layer 115 may include an insulating material such as silicon oxide or silicon nitride. However, exemplary embodiments of the present inventive concepts are not limited thereto.

In an exemplary embodiment, the first gate layers 120 may include one or more first lower gate layers, and a plurality of first upper gate layers on the one or more first lower gate layers, and the second gate layers 220 may include a plurality of second lower gate layers, and one or more second upper gate layers on the plurality of second lower gate layers.

Among the first gate layers 120 and the second gate layers 220, the plurality of first upper gate layers and the plurality of second lower gate layers may include word lines. At least one of the one or more first lower gate layers may be a lower select gate line, and at least one of the one or more second upper gate layers may be an upper select gate line.

The semiconductor device 1000 according to an exemplary embodiment may further include an upper interlayer insulating layer 215 disposed on the second stack group 200 (e.g., in the Z direction), and a capping layer 232 disposed on the upper interlayer insulating layer 215 (e.g., in the Z direction). The conductive line 240 may be disposed on the capping layer 232. For example, as shown in the exemplary embodiment of FIG. 2A, a bottom surface of the upper interlayer insulating layer 215 may contact a top surface of the second uppermost interlayer insulating layer 210U. A bottom surface of the capping layer 232 may contact a top surface of the upper interlayer insulating layer 215. A bottom surface of the conductive line 240 may contact a top surface of the capping layer 232.

The first vertical structures 80 may pass through the first and second stack groups 100 and 200 and the intermediate interlayer insulating layer 115 in the Z direction. In an exemplary embodiment, the first vertical structures 80 may have upper surfaces, substantially coplanar with each other (e.g., the distance of the upper surfaces of the first vertical structures to an upper surface of the substrate 10 in the Z direction). In an exemplary embodiment, the first vertical structures 80 may have substantially the same width (e.g., length in the Y direction).

As shown in the exemplary embodiment of FIG. 2C, each of the first vertical structures 80 may include a gap fill insulation pattern 81, a vertical channel pattern 82 on the gap fill insulation pattern 81, a tunnel insulation film 83 on the vertical channel pattern 82, a charge storage film 84 on the tunnel insulation film 83, a blocking insulation film 85 on the charge storage film 84, and a capping pattern 86 covering an upper surface of the gap fill insulation pattern 81 and connected to the vertical channel pattern 82. The blocking insulation film 85, the charge storage film 84, the tunnel insulation film 83, the vertical channel pattern 82, and the gap fill insulation pattern 81 may be arranged from sidewalls of the first and second stacks 100, 200 and side and bottom surfaces of the substrate 10 toward the inside of the first vertical structures 80 in sequence. For example, the vertical channel pattern 82 may cover side and bottom surfaces of the gap fill insulation pattern 81 (e.g., surfaces of the gap fill insulation pattern extending substantially in the Z direction and Y direction, respectively), the tunnel insulation film 83 may cover side and bottom surfaces of the vertical channel pattern 82, the charge storage film 84 may cover side and bottom surfaces of the tunnel insulation film 83, and the blocking insulation film 85 may cover side and bottom surfaces of the charge storage film 84. The vertical channel pattern 82 may be disposed between the gap fill insulation pattern 81 and the tunnel insulation film 83, the tunnel insulation film 83 may be disposed between the vertical channel pattern 82 and the charge storage film 84, and the charge storage film 84 may be disposed between the tunnel insulation film 83 and the blocking insulation film 85.

In an exemplary embodiment, the tunnel insulation film 83 of the first vertical structures 80 may tunnel charge to the charge storage layer 84. In an exemplary embodiment, the tunnel insulation film 83 may include at least one compound selected from, silicon oxide ($SiO_2$), silicon nitride ($Si_3N_4$), silicon oxynitride (SiON), or combinations thereof. The charge storage film 84 may be a charge trap layer or a floating gate conductive layer. In an exemplary embodiment, the blocking insulation film 85 may include at least one compound selected from silicon oxide ($SiO_2$), silicon nitride ($Si_3N_4$), silicon oxynitride (SiON), high-k dielectric material, or a combination thereof.

In an exemplary embodiment, the charge storage film 84 of the first vertical structures 80 may include regions that are capable of storing information in a semiconductor device, such as a vertical NAND flash memory device, etc. For example, regions of the charge storage layer 84, disposed between gate layers, which may be word lines, among the first and second gate layers 120 and 220, and the vertical channel pattern 82, may be regions capable of storing data in the vertical NAND flash memory device.

In an exemplary embodiment, the vertical channel pattern 82 of the first vertical structures 80 may be a channel layer or a channel region of the vertical NAND flash memory device.

The semiconductor device 1000 may further include a contact plug 235 disposed on the first vertical structures 80 and passing through the upper interlayer insulating layer 215 to contact the capping pattern 86. The contact plug 235 may be electrically connected to the capping pattern 86 and the conductive line 240. For example, as shown in the exemplary embodiment of FIG. 2A, the contact plug 235 may extend in the Z direction from a bottom portion of the conductive line 240 to a top portion of the gate capping pattern 86. The conductive line 240 may be electrically connected to the first vertical structures 80 through the contact plug 235.

First vertical structures 80a1 and 80b1 in the first region R1 of the semiconductor device 1000 according to an exemplary embodiment of the present inventive concepts will be described.

The first vertical structures 80a1 and 80b1 may include a first vertical region 80V1, and a second vertical region 80V2 on the first vertical region 80V1, respectively. Each of the first and second vertical regions 80V1 and 80V2 may have a sloped lateral surface of which a width (e.g., length between opposing sidewalk of the first and second vertical regions 80V1 and 80V2 in the Y direction) narrows toward the substrate 10.

The first vertical region 80V1 may include a first upper vertical region 80u1 adjacent to the second vertical region 80V2 (e.g., in the Z direction), and a first lower vertical region 80l1 adjacent to the substrate 10 (e.g., in the Z direction). The first lower vertical region 80l1 has a width that is smaller than a width of the first upper vertical region 80u1.

The second vertical region 80V2 may include a second lower vertical region 80l2 adjacent to the first vertical region 80V1 (e.g., in the Z direction) and having a width that is smaller than the width of the first upper vertical region 80u1, and a second upper vertical region 80u2 adjacent to the conductive line 240 (e.g., in the Z direction) and having a width that is larger than the width of the second lower vertical region 80l2.

As shown in the exemplary embodiment of FIG. 2C, the first vertical structures 80a1 and 80b1 may include a first bend portion b80 formed by a difference in width between the first upper vertical region 80u1 and the second lower vertical region 80l2. The first bend portion b80 may be interposed between the first stack group 100 and the second stack group 200 (e.g, in the Z direction).

The first bend portion b80 may be disposed at the same height as an upper surface of the intermediate interlayer insulating layer 115 in the Z direction. The first bend portion b80 may contact the second lowermost interlayer insulating layer 210L. For example, as shown in the exemplary embodiment of FIG. 2C, the first bend portion b80 may directly contact a bottom surface of the second lowermost interlayer insulating layer 210L.

The first bend portions b80 may extend from a portion through which the first vertical structures 80a1 and 80b1 pass through the intermediate interlayer insulating layer 115, to the upper surface of the intermediate interlayer insulating layer 115.

Second vertical structures 80a2 and 80b2 in the second region R2 of the semiconductor device 1000 according to an exemplary embodiment of the present inventive concepts will be described.

The second vertical structures 80a2 and 80b2 may include a first vertical region 80V1, and a second vertical region 80V2 on the first vertical region 80V1, respectively. The descriptions of the first and second vertical regions 80V1 and 80V2 may be the same as those described above with respect to the first vertical structures 80a1 and 80b1, and therefore will be omitted.

The second vertical structures 80a2 and 80b2 may have a structure in which a central portion of the first vertical region 80V1 and a central portion of the second vertical region 80V2 are not aligned in the Z direction. For example, the second vertical structures 80a2 and 80b2 may have a structure in which a central portion of the second vertical region 80V2 is offset by a predetermined distance (e.g., in the Y direction) as compared to a central portion of the first vertical region 80V1. For example, as shown in the exemplary embodiments of FIGS. 2A-2B, a midpoint of the width (e.g., length between opposing sidewalls in the Y direction) of the first upper vertical region 80u1 of the second vertical structures 80a2 and 80b2 may be offset in the Y direction from a midpoint of the width (e.g., length between opposing sidewalls in the Y direction) of the adjacent second lower vertical region 80l2 of the second vertical structures 80a2 and 80b2.

In an exemplary embodiment, since the second vertical structures 80a2 and 80b2 have a structure in which the first vertical region 80V1 and the second vertical region 80V2 are not aligned in the Z direction, the second vertical structures 80a2 and 80b2 may include a first upper bend portion ub80 and a first lower bend portion lb80. The first lower bend portion lb80 is disposed at a lower height (e.g., distance from the substrate 10 in the Z direction) than the first upper bend portion ub80. The first lower bend portion lb80 may be bent from a portion of the first upper vertical region 80u1 in a lateral direction (e.g., the Y direction), and may be then bent in the Z direction.

The plurality of separation structures 180a and 180b may pass through the first and second stack groups 100 and 200, the upper interlayer insulating layer 215, and the intermediate interlayer insulating layer 115 in the Z direction. The plurality of separation structures 180a and 180b may extend upwardly (e.g., in the Z direction) from a portion extending through the second stack group 200 to extend through the upper interlayer insulating layer 215. The plurality of separation structures 180a and 180b may have upper surfaces, substantially coplanar with each other. For example, as shown in the exemplary embodiment of FIGS. 2A and 2B, the separation structures 180a and 180b may each have upper surfaces which terminate at a bottom surface of the capping layer 232 and are coplanar with each other. The plurality of separation structures 180a and 180b may have substantially the same width (e.g., length in the Y direction).

The plurality of separation structures 180a and 180b may include first separation structures 180a and second separation structures 180b. The first separation structures 180a may be disposed in the first region R1, and the second separation structures 180b may be disposed in the second region R2.

The first separation structures 180a in the first region R1 of the semiconductor device 1000 according to an exemplary embodiment of the present inventive concepts will be described.

The first separation structures 180a may include a first separation region 180V1, and a second separation region 180V2 on the first separation region 180V1. For example, as shown in the exemplary embodiments of FIGS. 2A-2B, the second separation region 180V2 may be disposed directly on the first separation region 180V1 (e.g., in the Z direction). Each of the first and second separation regions 180V1 and 180V2 may have a sloped lateral surface having a width length between opposing sidewalls in the Y direction) that narrows toward the substrate 10.

The first separation region 180V1 may include a first upper separation region 180u1 adjacent to the second separation region 180V2 (e.g., in the Z direction), and a first lower separation region 180/1 adjacent to the substrate 10 (e.g., in the Z direction) and having a width that is smaller than a width of the first upper separation region 180u1.

The second separation region 180V2 may include a second lower separation region 180/2 adjacent to the first separation region 180V1 (e.g., in the Z direction) and having a width (e.g., length between opposing sidewalls in the Y direction) that is smaller than the width of the first upper separation region 180u1. A second upper separation region 18u2 is adjacent to the second lower separation region 180/2 (e.g., in the Z direction) and has a width (e.g., length between opposing sidewalls in the Y direction) that is wider than the width of the second lower separation region 180/2.

The first separation structures 180a may include a second bend portion b180 formed by a difference in width between the first upper separation region 180u1 and the second lower separation region 180/2. The differences in width between the upper separation region 180u1 and the second lower separation region 180/2 on the right and left lateral sides (e.g., in the Y direction) may be substantially the same and the second bend portion b180 on the left and right lateral sides may be substantially the same. The second bend portion b180 may be interposed between the first stack group 100 and the second stack group 200 (e.g., in the Z direction).

The second bend portion b180 may be disposed at the same height (e.g, distance from the substrate 10 in the Z direction) as a lower, surface of the intermediate interlayer insulating layer 115. The second bend portion b180 may be in contact with an upper end of the first uppermost interlayer insulating layer 110U.

The second bend portion b180 may extend from a portion through which the separation structure 180 passes through the intermediate interlayer insulating layer 115, to the lower surface of the intermediate interlayer insulating layer 115.

The second separation structures 180b in the second region R2 of the semiconductor device 1000 according to an exemplary embodiment of the present inventive concepts will be described.

The second separation structures 180b may include a first separation region 180V1, and a second separation region 180V2 on the first separation region 180V1. The descriptions of the first and second separation regions 180V1 and 180V2 may be the same as those described above with respect to the first separation structures 180a, and therefore will be omitted.

The second separation structures 180b may be a structure in which a central portion of the first separation region 180V1 and a central portion of the second separation region 180V2 are not aligned in the Z direction. For example, the second separation structures 180b may have a structure in which a central portion of the second separation region 180V2 is offset by a predetermined distance in the Y direction from a central portion of the first separation region 180V1. For example, as shown in the exemplary embodiments of FIGS. 2A, 2B and 2D a midpoint of the width (e.g., length between opposing sidewalls in the Y direction) of the first upper separation region 180u1 of the second separation structures 180b may be offset in the Y direction from a midpoint of the width (e.g., length between opposing sidewalls in the Y direction) of the adjacent second lower separation region 180/2 of the second separation structures 180b.

Referring to FIGS. 2A and 2C, the first vertical structures 80a1 and 80b1 and the first separation structures 180a in the first region R1 of the semiconductor device 1000 according to an exemplary embodiment of the present inventive concepts will be further described.

A distance (e.g., length in the Z direction) between an upper end of the first vertical region 80V1 (e.g., a top portion of the first upper vertical region 80u1) and the upper surface 10s of the substrate 10 may be greater than a distance (e.g., length in the Z direction) between an upper end of the first separation region 180V1 (e.g., a top portion of the first upper separation region 180u1) and the upper surface 10s of the substrate 10. For example, the first vertical region 80V1 of the first vertical structures 80a1 and 80b1 extend higher in the Z direction than the first separation region 180V1 of the first separation structures 180a.

In an exemplary embodiment, a distance of the second separation region 180V2 in the vertical direction (e.g., in the Z direction) may be greater than a distance of the second vertical region 80V2 in the vertical direction (e.g., in the Z direction). For example, as shown in the exemplary embodiments of FIG. 2A, the second separation region may extend from a bottom surface of the intermediate interlayer insulating layer 115 to a bottom surface of the capping layer 232 in the Z direction which is greater than the length that the second vertical region 80V2 extends between an upper portion of the intermediate interlayer insulating layer 115 to a bottom surface of the upper interlayer insulating layer in the Z direction.

A first distance D1 between an upper end of the first bend portion b80 and a top surface of the first uppermost gate layer 120U (e.g., a distance in the Z direction) may be greater than a second distance D2 between an upper end of the second bend portion b180 and a top surface of the first uppermost gate layer 120U (e.g., a distance in the Z direction).

A third distance D3 between the upper end of the first bend portion b80 and a bottom surface of the second lowermost gate layer 220L (e.g., a distance in the Z direction) may be shorter than a fourth distance D4 between the upper end of the second bend portion b180 and a bottom surface of the second lowermost gate layer 220L.

As shown in the exemplary embodiment of FIG. 2C, a first gap G1 between the upper end of the first bend portion b80 of the first vertical structures 80a and the upper end of the second bend portion b180 of the first separation structures 180a may be substantially equal to a thickness of the intermediate interlayer insulating layer 115 (e.g., distance between top and bottom surfaces of the intermediate interlayer insulating layer 115 in the Z direction). The second bend portion b180 may be disposed below the first bend portion b80 (e.g., in the Z direction) by the first gap G1. The first gap G1 may be configured to prevent the first separation structures 180a from contacting the first vertical structures 80a1 and 80b1. Therefore, defects of the semiconductor device, which may be caused by the removal of portions of the blocking insulation film 85, the charge storage film 84, the tunnel insulation film 83, and the vertical channel pattern 82 which may be included in the first vertical structures 80a1 and 80b1 may be prevented.

For example, in a comparative embodiment in which the second bend portion b180 in the first region R1 is disposed above the first bend portion b80, the first upper vertical region 80u1 may be disposed adjacent to the first upper separation region 180u1 (e.g., in the Y direction) and therefore be in contact therewith. However, in an exemplary embodiment of the present inventive concepts in which the second bend portion b180 is disposed below the first bend portion b80, the first upper vertical region 80u1 may be disposed adjacent to the second lower separation region 180l2 (e.g., in the Y direction). The first upper vertical region 80u1 is relatively difficult to be in contact with the second lower separation region 180l2 because the second lower separation region 180l2 has a width that is smaller than a width of the first upper separation region 180u1.

As shown in the exemplary embodiment of FIG. 2C, the first uppermost gate layer 120U and the second lowermost gate layer 220L may be spaced apart (e.g., in the Z direction) from each other by a second gap G2. The second gap G2 may be a distance of a region in the vertical direction (e.g., the Z direction) in which the first vertical structures 80a1 and 80b1 are not subjected to a field effect by a voltage applied to the first and second gate layers 120 and 220. In an exemplary embodiment, the second gap G2 may be maintained at a predetermined value. For example, in embodiments in which the second gap G2 is greater than the predetermined value, electrons in the vertical channel pattern 82 may not smoothly flow. In embodiments in which the second gap G2 is smaller than the predetermined value, the first bend portion b80 may contact the first gate layers 120 which may cause defects of the semiconductor device 1000.

Therefore, a predetermined value for the second gap G2 may be properly maintained which permits the electrons in the vertical channel pattern 82 to flow smoothly and prevents the first bend portion b80 from contacting the first gate layers 120.

In exemplary embodiments in which the first bend portion b80 is disposed at a higher height (e.g., distance from the substrate 10 in the Z direction) than a height of the second bend portion b180, a distance between the second vertical region 80V2 and the first separation structures 180a may be relatively large. Therefore, since the first gap G1 is not required to be equal to or greater than a predetermined value, the structure may be controlled to properly maintain the second gap G2, to provide a semiconductor device having a higher level of integration and an improved reliability.

Referring to FIGS. 2A and 2D, the second vertical structures 80a2 and 80b2 and the second separation structures 180b in the second region R2 of the semiconductor device 1000 according to an exemplary embodiment of the present inventive concept will be further described.

As previously described, the second vertical structures 80a2 and 80b2 may be a structure in which the central portion of the first vertical region 80V1 and the central portion of the second vertical region 80V2 are not aligned in the Z direction.

In an exemplary embodiment, the second vertical structures 80a2 and 80b2 may include a first lateral surface 80s1 extending from the first lower bend portion lb80 toward the first stack group 100 (e.g., in the Z direction), and a second lateral surface 80s2 extending from the first lower portion lb80 toward the second stack group 200 (e.g., in the Z direction). The first lower bend portion lb80 may extend from the first lateral surface 8s1 toward the second separation structures 180b, to be connected to the second lateral surface 80s2.

In an exemplary embodiment, the first upper bend portion ub80 may be disposed closer to the second lowermost gate layer 220L (e.g., in the Z direction), compared to the first lower bend portion lb80. For example, as shown in the exemplary embodiment of FIG. 2D, the first upper bend portion ub80 may be in contact with the lower surface of the second lowermost interlayer insulating layer 210L, and may be disposed at the same height as the upper end of the intermediate interlayer insulating layer 115 in the Z direction. In contrast, the first lower bend portion lb80 may be disposed at a lower height than the upper end of the intermediate interlayer insulating layer 115 in the Z direction. For example, the first lower bend portion lb80 may be disposed on a mid-portion of the intermediate interlayer insulating layer 115 (e.g., in the Z direction).

The first upper bend portion ub80 may be disposed to be substantially coplanar with the upper surface of the intermediate interlayer insulating layer 115, and the second bend portion b180 may be disposed to be substantially coplanar with the lower surface of the intermediate interlayer insulating layer 115. Since the first separation region 180V1 and the second separation region 180V2 are not aligned in the second region R2, the differences in width between the upper separation region 180u1 and the second lower separation region 180l2 on the right and left lateral sides (e.g., in the Y direction) may be different. For example, the second bend portion b180 on the left side may extend further in the Y direction than the second bend on the right lateral side.

In an exemplary embodiment, a distance (e.g., in the Z direction) between the first upper bend portion ub80 and a top surface of the first uppermost gate layer 120U may be greater than a distance (e.g., in the Z direction) between the first lower bend portion lb80 and a top surface of the first uppermost gate layer 120U. A distance (e.g., in the Z direction) between the upper end of the first vertical region 80V1 and the upper surface 10s of the substrate 10 may be greater than a distance (e.g., in the Z direction) between the lower end of the second vertical region 80V2 and the upper surface 10s of the substrate 10.

For example, the second bend portion b180 of the second separation structures 180b may be disposed lower (e.g., in the Z direction) than the first lower and upper bend portions lb80 and ub80 of the second vertical structures 80a2, 80b2, respectively. The first lower bend portion lb80 may be disposed at a higher position than the second bend portion b180 in the Z direction. For example, as shown in the exemplary embodiment of FIG. 2D, when an imaginary line extends in the Y direction from the first lower bend portion lb80, the imaginary extension line may be spaced apart from the second bend portion b180 by a first distance G1a in the Z direction.

Since the first lower bend portion lb80 is disposed higher than the second bend portion b180 by the first distance G1a in the Z direction, the first lower bend portion lb80 is prevented from contacting the second separation structures 180b.

Since the semiconductor device 1000 according to an exemplary embodiment of the present inventive concepts may sufficiently secure the first distance G1a between the first lower bend portion lb80 and the second bend portion b180 in the Z direction, a distance of a second recess RC2 (see FIG. 9) for forming the first lower bend portion lb80 may be maintained at a predetermined value, and may prevent the first lower bend portion lb80 from contacting the second separation structures 180b.

FIG. 2E illustrates the second vertical region 80V2 of the semiconductor device 1000 according to an exemplary embodiment of the present inventive concepts.

Referring to FIGS. 2A and 2E, the horizontal connection pattern 30 may be disposed between the substrate 10 and the first stack group 100 (e.g., in the Z direction). The horizontal connection pattern 30 may include a first horizontal connection pattern 12, and a second horizontal connection pattern 34 disposed on the first horizontal connection pattern 32. The first horizontal connection pattern 32 may be disposed between the substrate 10 and the first stack group 100, and the second horizontal connection pattern 34 may be disposed between the first horizontal connection pattern 32 and the first stack group 100. The first and second horizontal connection patterns 32 and 34 may be arranged to extend parallel to the upper surface 10s of the substrate 10 (e.g., in the Y direction).

In an exemplary embodiment, the first horizontal connection pattern 32 may be formed of silicon. The second horizontal connection pattern 34 may be formed of silicon. The first horizontal connection pattern 32 and the second horizontal connection pattern 34 may be formed of doped polysilicon. For example, the first horizontal connection pattern 32 and the second horizontal connection pattern 34 may be formed of polysilicon having an N-type conductivity. In another exemplary embodiment, at least one of the first horizontal connection pattern 32 and the second horizontal connection pattern 34 may include a metal (e.g., W, or the like) or a metal nitride (e.g., WN, TiN, or the like). The first horizontal connection pattern 32 may be in contact with the substrate 10. For example, as shown in the exemplary embodiment of FIG. 2A, a bottom surface of the first horizontal connection pattern 32 may be disposed directly on a top surface of the substrate 10 (e.g., in the Z direction).

The plurality of vertical structures 80, 80' may pass through the stacked structure GS and the horizontal connection pattern 30, and may extend into the substrate 10.

The first horizontal connection pattern 32 may contact a first vertical lower region 80/1, and may extend from the blocking insulating layer 85 toward the gap fill insulation pattern 81 to contact the vertical channel pattern 82. For example, the first horizontal connection pattern 32 may extend in the Y direction through the blocking insulating layer 85, the charge storage film 84 and the tunnel insulation film 83 to contact the vertical channel pattern 82. The first horizontal connection pattern 32 includes a first extended portion 32e1 extending in the Z direction from a portion contacting the vertical channel pattern 82 to a portion between the second horizontal connection pattern 34 and the vertical channel pattern 82. The first horizontal connection pattern 32 also includes a second extended portion 32e2 extending in the Z direction between the substrate 10 and the vertical channel pattern 82.

In an exemplary embodiment, each of the first and second extended portions 32e1 and 32e2 of the first horizontal connection pattern 32 may have a length (e.g., in the Z direction) that is shorter than a thickness of the second horizontal connection pattern 34 (e.g., distance between a top surface and bottom surface of the second horizontal connection pattern 34 in the Z direction). For example, as shown in the exemplary embodiment of FIG. 2E, the first extended portion 32e1 of the first horizontal connection pattern 32 has a length that extends (e.g., in the Z direction) to a middle portion of the thickness of the second horizontal connection pattern 34. The second extended portion 32e2 of the first horizontal connection pattern 32 has a substantially same length as the first extended portion 32e1.

Figure 3:
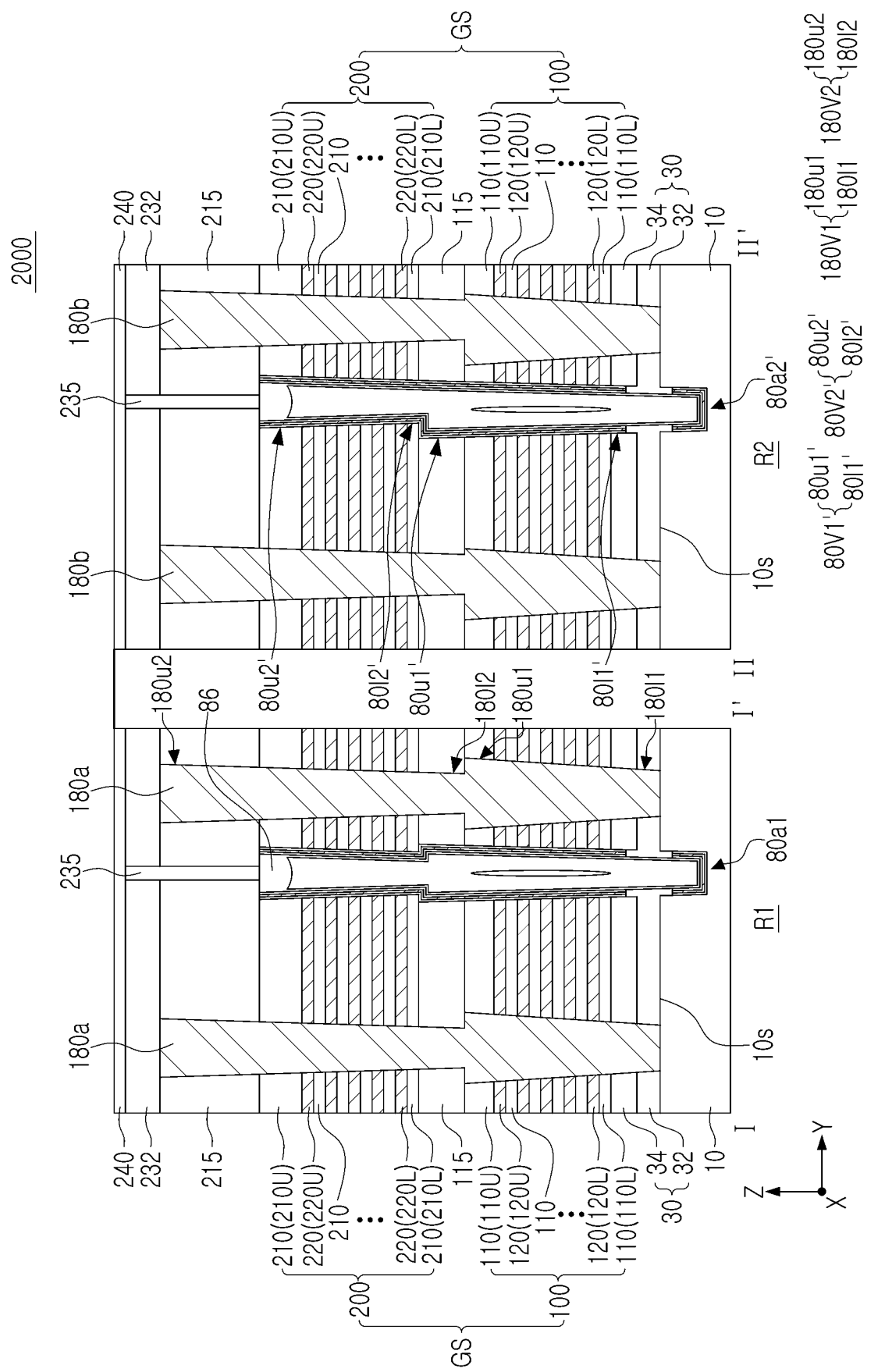
FIGS. 3 and 4 are cross-sectional views illustrating a semiconductor device according to exemplary embodiments of the present inventive concepts.

A semiconductor device 2000 according to a modified exemplary embodiment will be described with reference to FIG. 3. FIG. 3 is a cross-sectional view illustrating regions taken along lines I-I' and II-II' of FIG. 1, respectively. Hereinafter, modified elements of the above-described elements will be mainly described, explanation of other elements may be omitted.

In a second region R2, second vertical structures 80a2' may include a first vertical region 80V1', and a second vertical region 80V2' on the first vertical region 80V1'. A central portion of the second vertical region 80V2' and a central portion of the first vertical region 80V1' may be not aligned with each other in the Z direction in a manner differently than the alignment of the second separation structures 180b. However, exemplary embodiments of the present inventive concepts are not limited thereto. As shown in the exemplary embodiment of FIG. 3, a lateral surface of the first vertical region 80V1' and a lateral surface of the second vertical region 80V2' may be substantially coplanar with each other. For example, a right sidewall of the first upper vertical section 80u1' and a right sidewall of the second lower vertical section 80/2' may be aligned and a lower bend portion may not be formed.

In a similar manner to those described above with reference to FIGS. 2A to 2E, since a distance between the second vertical structures 80a2' and an upper surface 10s of a substrate 10 is greater than a distance between a second bend portion of the second separation structures 180b and the upper surface 10s of the substrate 10, defects, which may be caused by contact between the second vertical structures 80a2 and the second separation structures 180b, may be prevented.

Figure 4:
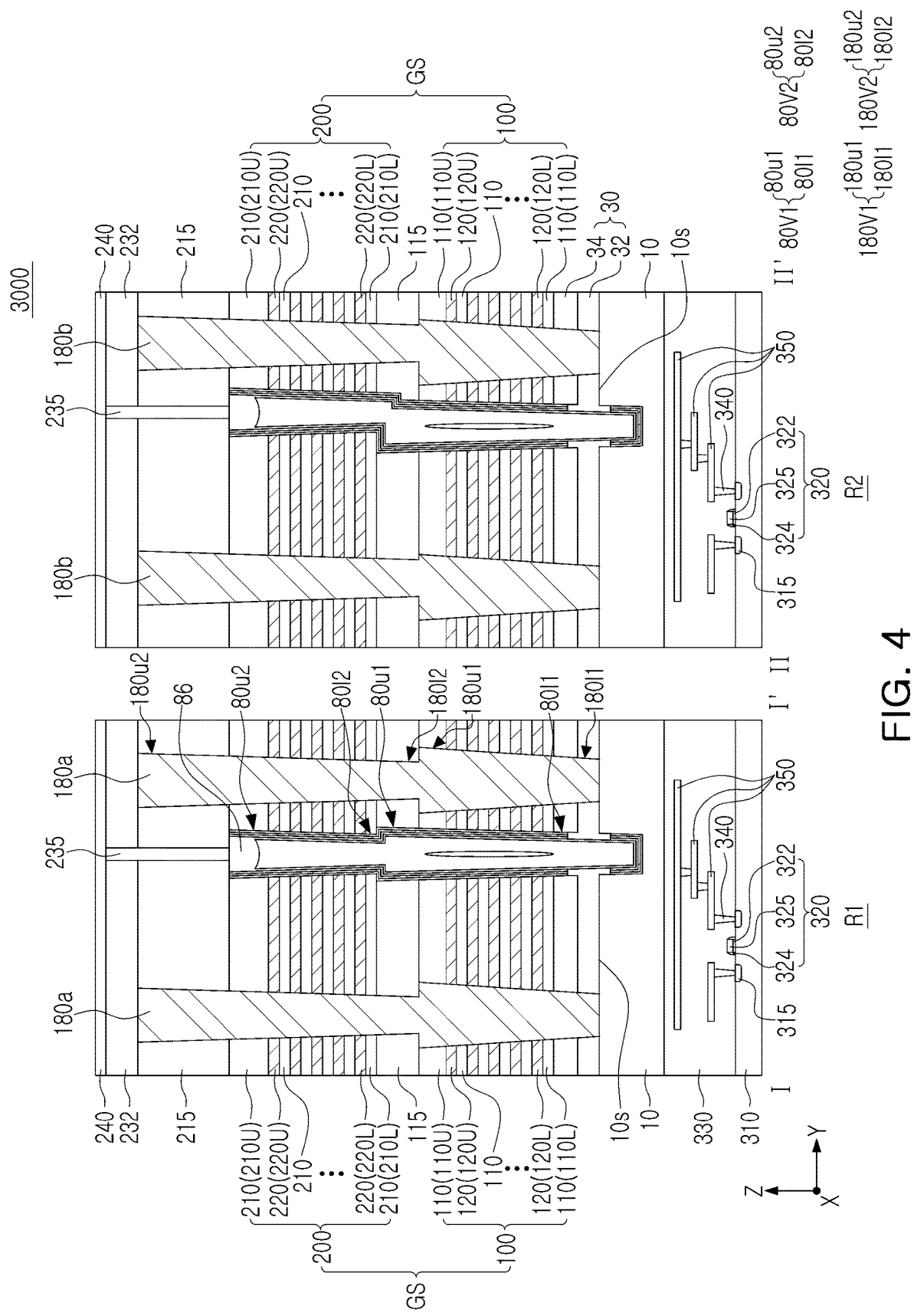

A semiconductor device 3000 according to a modified embodiment will be described with reference to FIG. 4. FIG. 4 is a cross-sectional view illustrating regions corresponding to the regions taken along lines I-I' and II-II' of FIG. 1, respectively. Hereinafter, modified elements of the above-described elements will be mainly described, and other elements will be directly quoted or the explanation thereof will be omitted.

In the semiconductor device 3000, a peripheral circuit region may be disposed under the substrate 10 (e.g., in the Z direction).

The peripheral circuit region may include a base substrate 310, and circuit elements 320, circuit contact plugs 340, and circuit wiring lines 350, arranged on the base substrate 310.

The base substrate 310 may have an upper surface extending in the X and Y directions. In an exemplary embodiment, discrete element separation layers may be formed in the base substrate 310 to define an active region. Source/drain regions 315 containing impurities may be disposed in a portion of the active region. In an exemplary embodiment, the base substrate 310 may include a semiconductor material such as a Group IV semiconductor, a Group III-V compound semiconductor, or a Group II-VI oxide semiconductor. However, exemplary embodiments of the present inventive concepts are not limited thereto.

The circuit elements 320 may include planar transistors. Each of the circuit elements 320 may include a circuit gate dielectric layer 322, a spacer layer 324, and a circuit gate 325. The source/drain regions 315 may be disposed in the base substrate 310 on both sides of the circuit gate 325 (e.g., in the Y direction).

A peripheral region insulating layer 330 may be disposed on the circuit elements 320 on the base substrate 310. For example, as shown in the exemplary embodiment of FIG. 4, a bottom surface of the peripheral region insulating layer 330 may be disposed directly on a top Surface of the base substrate 310 (e.g., in the direction). The circuit contact plugs 340 may pass through the peripheral region insulating layer 330 to be connected to the source/drain regions 315. An electrical signal may be applied to the circuit elements 320 by the circuit contact plugs 340. The circuit contact plugs 340 may be also connected to the circuit gates 325. The circuit wiring lines 350 may be connected to the circuit contact plugs 340, and may be arranged as a plurality of layers.

A method for forming a semiconductor device according to exemplary embodiments of the present inventive concepts will be described with reference to FIGS. 1, and 5 to 14. FIGS. 5 to 14 illustrate exemplary embodiments of a method of forming the structure of the semiconductor device 1000 described with reference to FIGS. 1, and 2A to 2D.

Figure 5:
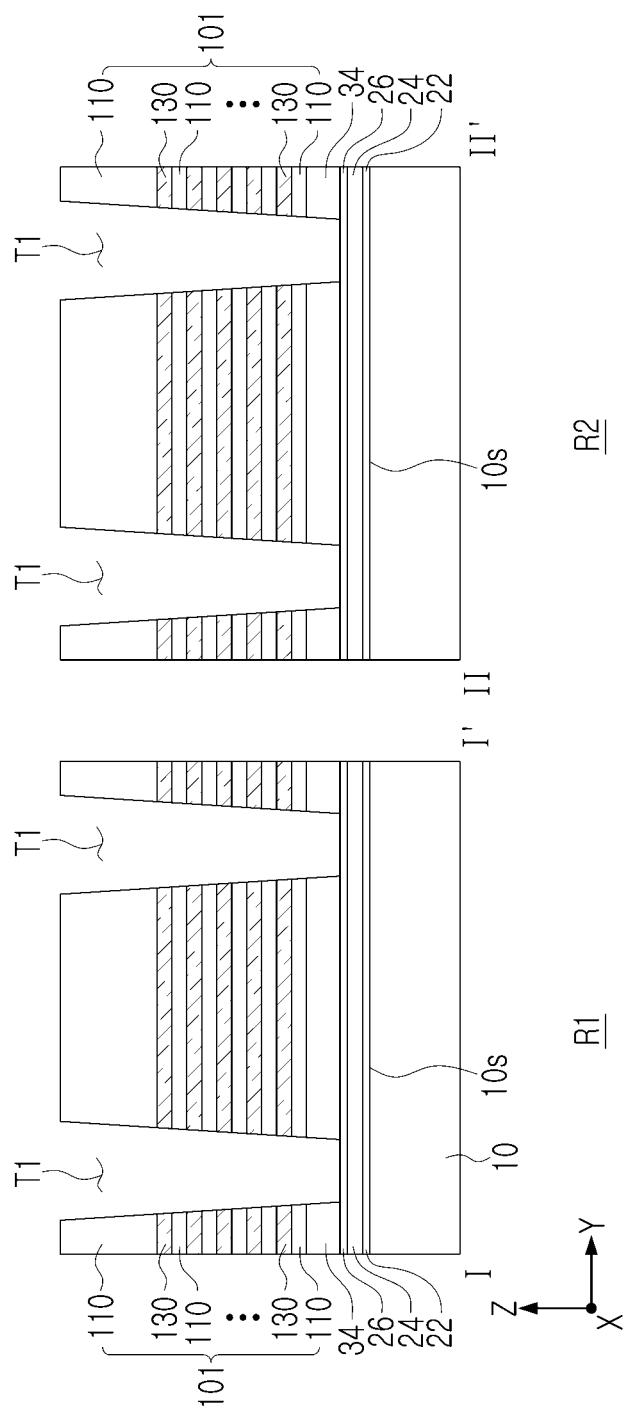
FIGS. 5 to 14 are cross-sectional views illustrating a method of manufacturing a semiconductor device according to exemplary embodiments of the present inventive concepts.

Referring to FIG. 5, a first horizontal insulating layer 22 may be formed on a substrate 10 (e.g., in the Z direction). A first preliminary horizontal connection pattern 24 may be formed on the first horizontal insulating layer 22 (e.g., in the Z direction). A second horizontal insulating layer 26 may be formed on the first preliminary horizontal connection pattern 24 (e.g., in the Z direction). A second horizontal connection pattern 34 may be formed on the second horizontal insulating layer 26 (e.g., in the Z direction).

A first mold structure 101 may be formed on the substrate 10. In an exemplary embodiment, the substrate 10 may include a semiconductor substrate. As shown in the exemplary embodiment of FIG. 5, the first mold structure 101 may be formed directly on the second horizontal connection pattern 34 (e.g., in the Z direction).

The formation of the first mold structure 101 may include forming first interlayer insulating layers 110 and first preliminary gate layers 130, alternately and repeatedly stacked on the substrate 10 (e.g., in the Z direction). In an exemplary embodiment, the first interlayer insulating layers 110 may include an insulating material such as silicon oxide. However, exemplary embodiments of the present inventive concepts are not limited thereto.

In an exemplary embodiment, the first preliminary gate layers 130 may include a different material than the first interlayer insulating layers 110. For example, the first preliminary gate layers 130 may include silicon nitride.

In another exemplary embodiment, the first preliminary gate layers 130 may include polysilicon.

First trenches T1 may be formed on the substrate 10 to pass through the first mold structure 101 and expose the second horizontal connection pattern 34. The first trenches may have a width (e.g., length in the Y direction) that decreases towards the upper, surface 10s of the substrate. As shown in the exemplary embodiment of FIG. 6, a first separation spacer 151 may be formed on lateral surfaces of the first trenches T1 to cover a portion of the exposed upper surface of the second horizontal connection pattern 34. In an exemplary embodiment, the first separation spacer 151 may be a film which may be removed in a subsequent operation. The first separation spacer 151 may include, but is not limited to, silicon nitride.

Figure 6:
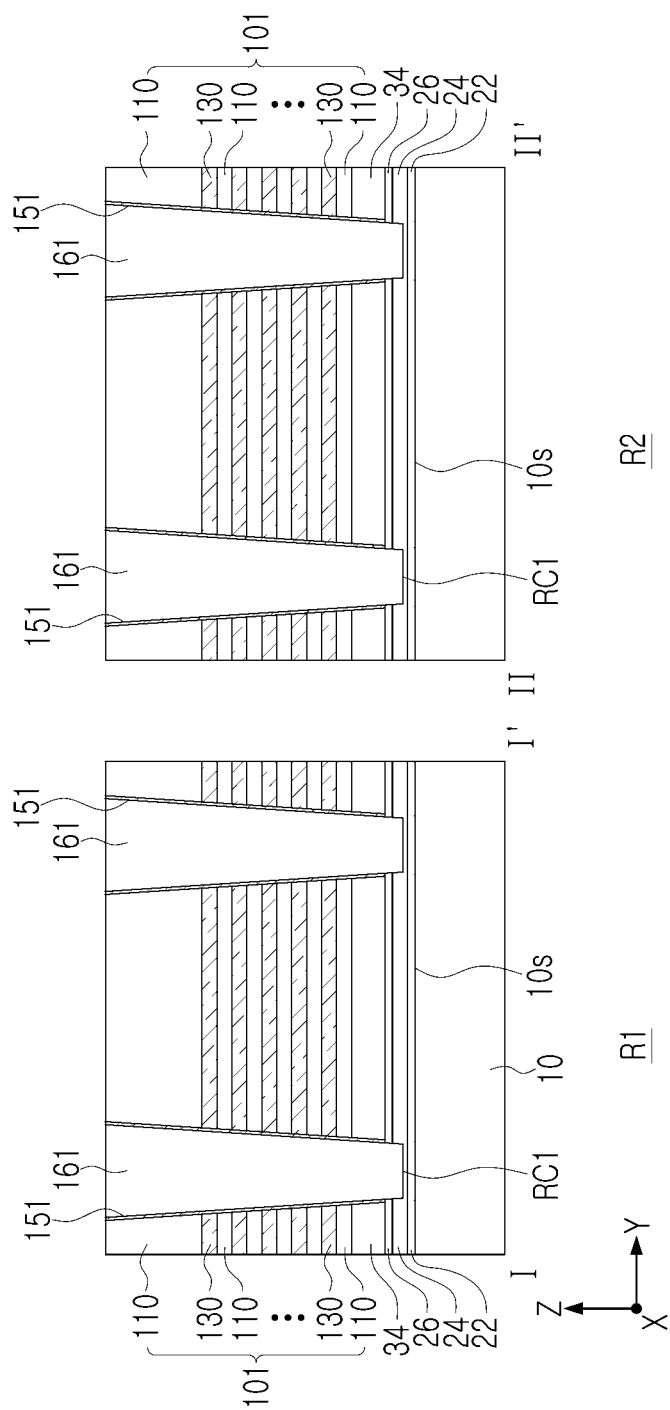

Referring to FIG. 6, a first recess RC1 extending from the first trench T1 toward the substrate 10 (e.g., in the Z direction) may be formed. For example, the first recess RC1 may pass through the second horizontal connection pattern 34 and the second horizontal insulating layer 26 to contact the first preliminary horizontal connection pattern 24. As shown in the exemplary embodiment of FIG. 6, the first recess RC1 may extend to a position between upper and lower surfaces of the first preliminary horizontal connection pattern 24.

First sacrificial separation structures 161 filling the first trench T1 and the first recess RC1 may be formed. In an exemplary embodiment, the first sacrificial separation structures 161 may include polysilicon. However, exemplary embodiments of the present inventive concepts are not limited thereto.

In an exemplary embodiment, a thickness (e.g., length between a top surface and bottom surface in the Z direction) of a first uppermost interlayer insulating layer disposed in an uppermost position among the first interlayer insulating layers 110 may be greater than a thickness of each of the remaining first interlayer insulating layers 110.

In an exemplary embodiment, an upper region of each of the first uppermost interlayer insulating layer, the first separation spacer 151, and the first sacrificial separation structures 161 may be removed, such as by a chemical mechanical polishing operation.

Figure 7:
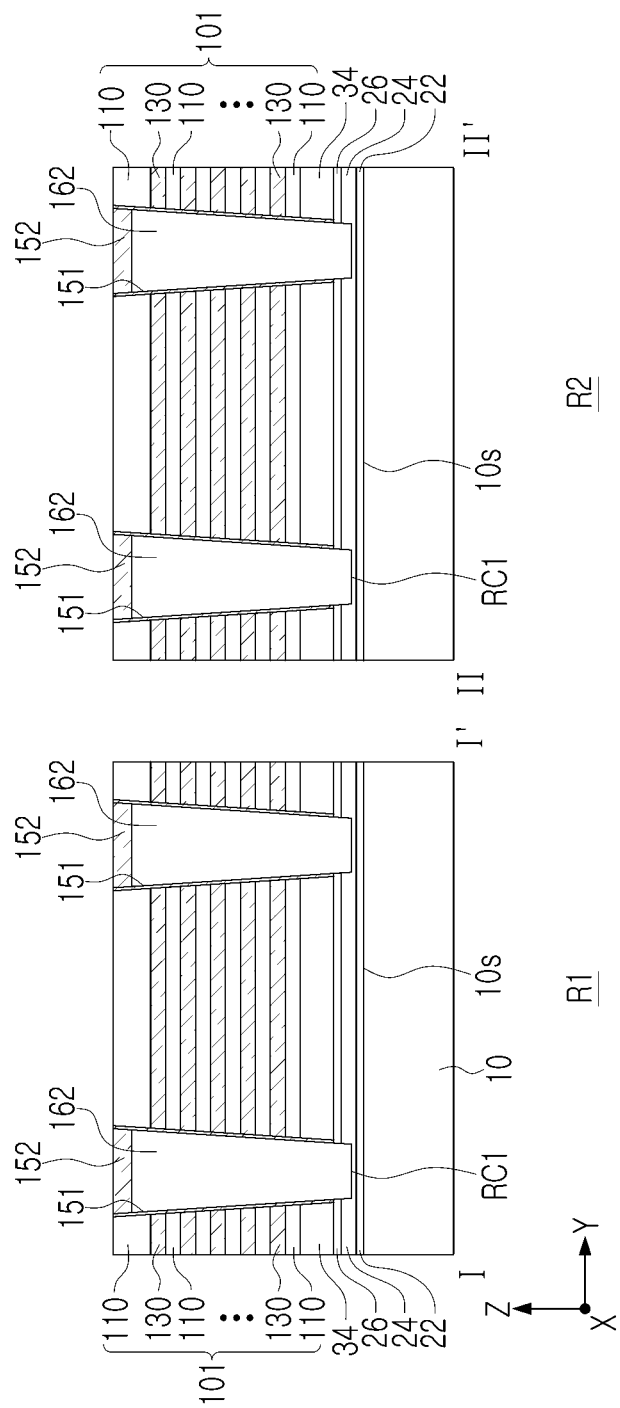

Referring to FIG. 7, upper regions of the first sacrificial separation structures 161 may be etched to form first preliminary separation structures 162. A capping separation spacer 152 covering the first preliminary separation structures 162 (e.g., a top surface of the first preliminary separation structures) may be formed. Lateral surfaces of the capping separation spacer 152 (e.g., lateral ends in the Y direction) may be in contact with the first separation spacer 151. In an exemplary embodiment, the capping separation spacers 152 may include silicon nitride. However, exemplary embodiments of the present inventive concepts are not limited thereto.

An upper surface of the capping separation spacer 152 may be substantially coplanar with an upper surface of the first uppermost interlayer insulating layer and an upper surface of the first separation spacer 151.

Figure 8:
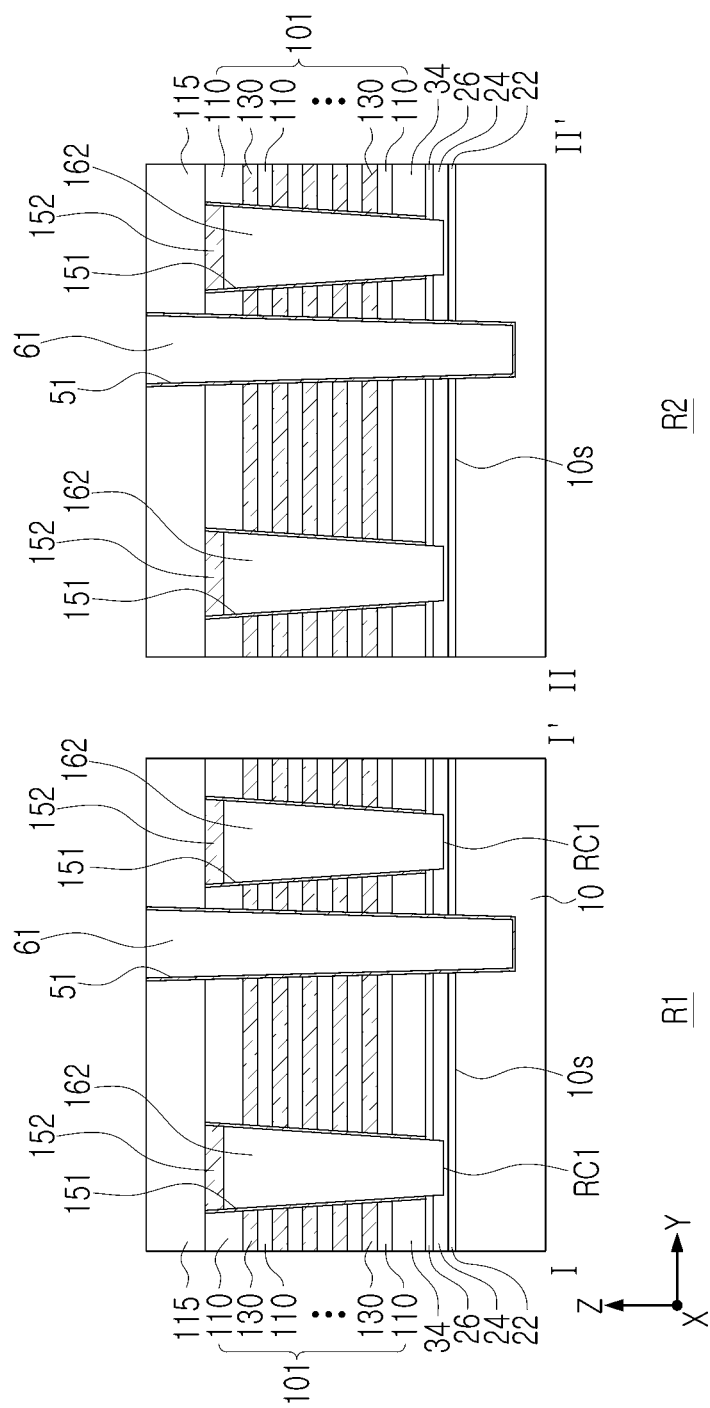

Referring to FIG. 8, an intermediate interlayer insulating layer 115 may be formed on the first mold structure 101. For example, as shown in the exemplary embodiment of FIG. 8, a bottom portion of the intermediate interlayer insulating layer 115 may be disposed directly on a top portion of the capping separation spacer 152 and the first uppermost interlayer insulating layer 110. In an exemplary embodiment, the intermediate interlayer insulating layer 115 may include an insulating material such as silicon oxide. However, exemplary embodiments of the present inventive concepts are not limited thereto.

A first vertical hole may be formed to pass through the intermediate interlayer insulating layer 115, the first mold structure 101, the second horizontal connection pattern 34, the second horizontal insulating layer 26, the first preliminary horizontal connection pattern 24, and the first horizontal insulating layer 22, and to extend below the upper surface 10s of the substrate 10. The first vertical hole may have a width (e.g., length in the Y direction) that decreases towards the upper surface 10s of the substrate.

A first vertical spacer 51 covering lower and lateral surfaces of the first vertical hole may be formed. In an exemplary embodiment, the first vertical spacer 51 may include silicon nitride. However, exemplary embodiments of the present inventive concepts are not limited thereto.

A first preliminary vertical structure 61 filling the first vertical hole and contacting the first vertical spacer 51 may be formed. In an exemplary embodiment, the first preliminary vertical structure 61 may include polysilicon. However, exemplary embodiments of the present inventive concepts are not limited thereto.

An upper surface of the first preliminary vertical structure 61 may be substantially coplanar with an upper surface of the intermediate interlayer insulating layer 115 and an upper surface of the first vertical spacer 51.

Figure 9:
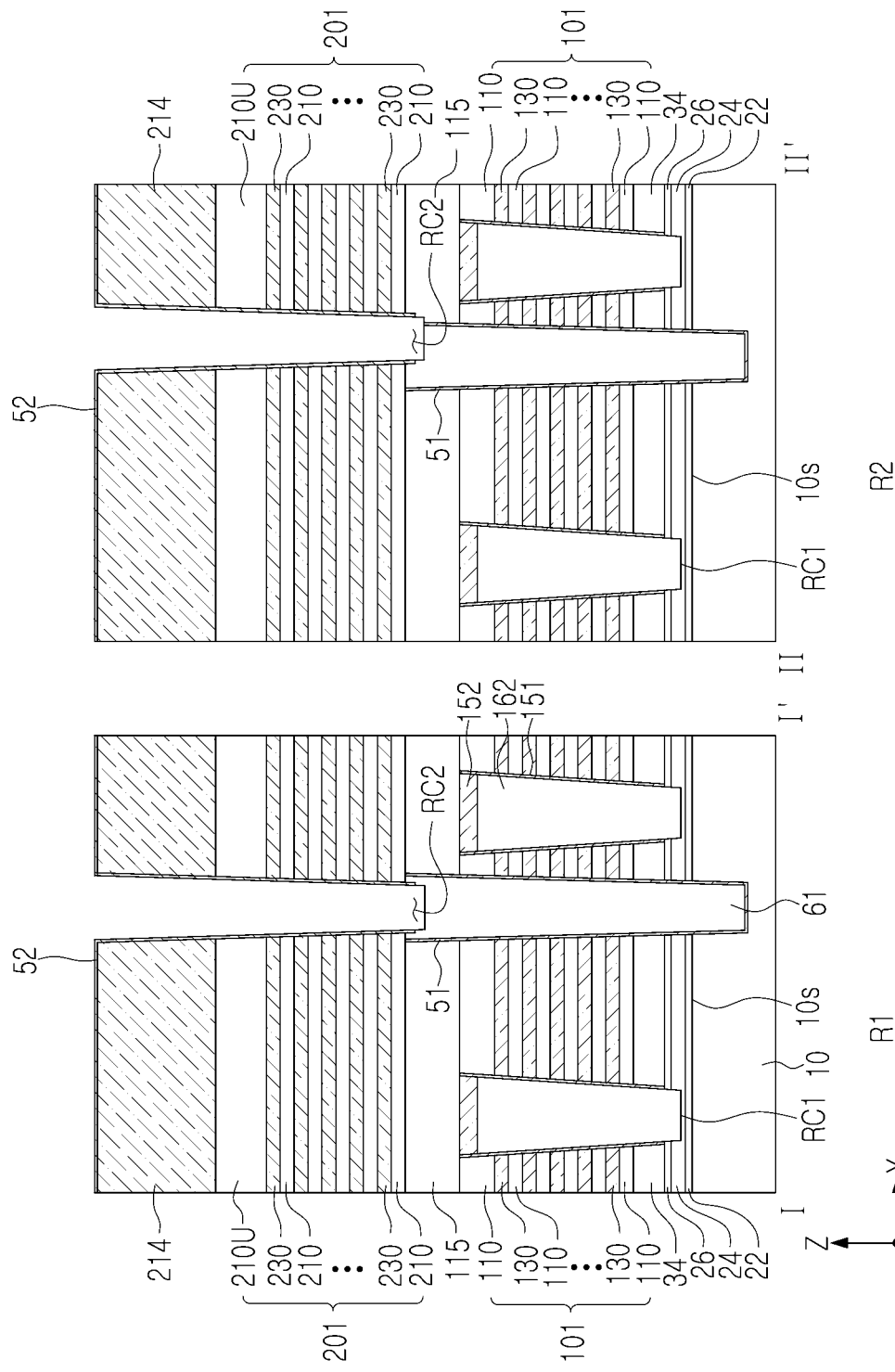

Referring to FIG. 9, a second mold structure 201 may be formed on the first mold structure 101. The intermediate interlayer insulating layer 115 may be interposed between the first mold structure 101 and the second mold structure 201. A bottom surface of the second mold structure 201 may be disposed directly on a top surface of the intermediate interlayer insulating layer 115.

The formation of the second mold structure 201 may include forming second interlayer insulating layers 210 and second preliminary gate layers 230, alternately and repeatedly stacked on the intermediate interlayer insulating layer 115 (e.g., in the Z direction). In an exemplary embodiment, the second interlayer insulating layers 210 may include an insulating material such as silicon oxide. However, exemplary embodiments of the present inventive concepts are not limited thereto.

In an exemplary embodiment, the second preliminary gate layers 230 may include a different material than the second interlayer insulating layers 210. For example, the second preliminary gate layers 230 may include silicon nitride.

In another exemplary embodiment, the second preliminary gate layers 230 may include polysilicon.

A preliminary upper interlayer insulating layer 214 may be formed on a second uppermost interlayer insulating layer 210U disposed in an uppermost position among the second interlayer insulating layers 210. For example, as shown in the exemplary embodiment of FIG. 9, a bottom surface of the preliminary upper interlayer insulating layer 214 may be disposed directly on a top surface of the second uppermost interlayer insulating layer 210U. In an exemplary embodiment, the preliminary upper interlayer insulating layer 214 may include silicon nitride.

A second vertical hole may be formed to pass through the preliminary upper interlayer insulating layer 214 and the second mold structure 201 and to contact an upper region of the first preliminary vertical structure 61. The second vertical hole may have a width (e.g., length in the Y direction) that decreases towards the upper surface 10s of the substrate.

A second vertical spacer 52 covering lateral surfaces of the second vertical hole may be formed.

A second recess RC2 extending (e.g., in the Z direction) from the second vertical hole toward the first preliminary vertical structure 61 by a predetermined depth may be formed. The second recess RC2 may be in contact with the upper region of the first preliminary vertical structure 61.

In an exemplary embodiment, since an upper end of the first preliminary vertical structure 61 may be disposed higher (e.g. in the Z direction) than an upper end of the first preliminary separation structures 162 and an upper end of the capping separation spacers 152, the second recess RC2 may be recessed by a desired depth, without contacting the first preliminary separation structures 162, the capping separation spacers 152, and the first preliminary gate layers 130.

In another exemplary embodiment shown in FIG. 9, the second vertical hole and the first vertical hole may not be aligned in the Z direction. Therefore, a lower end of the second vertical hole may partially contact the intermediate interlayer insulating layer 115, and the second recess RC2 may partially contact the intermediate interlayer insulating layer 115.

Figure 10:
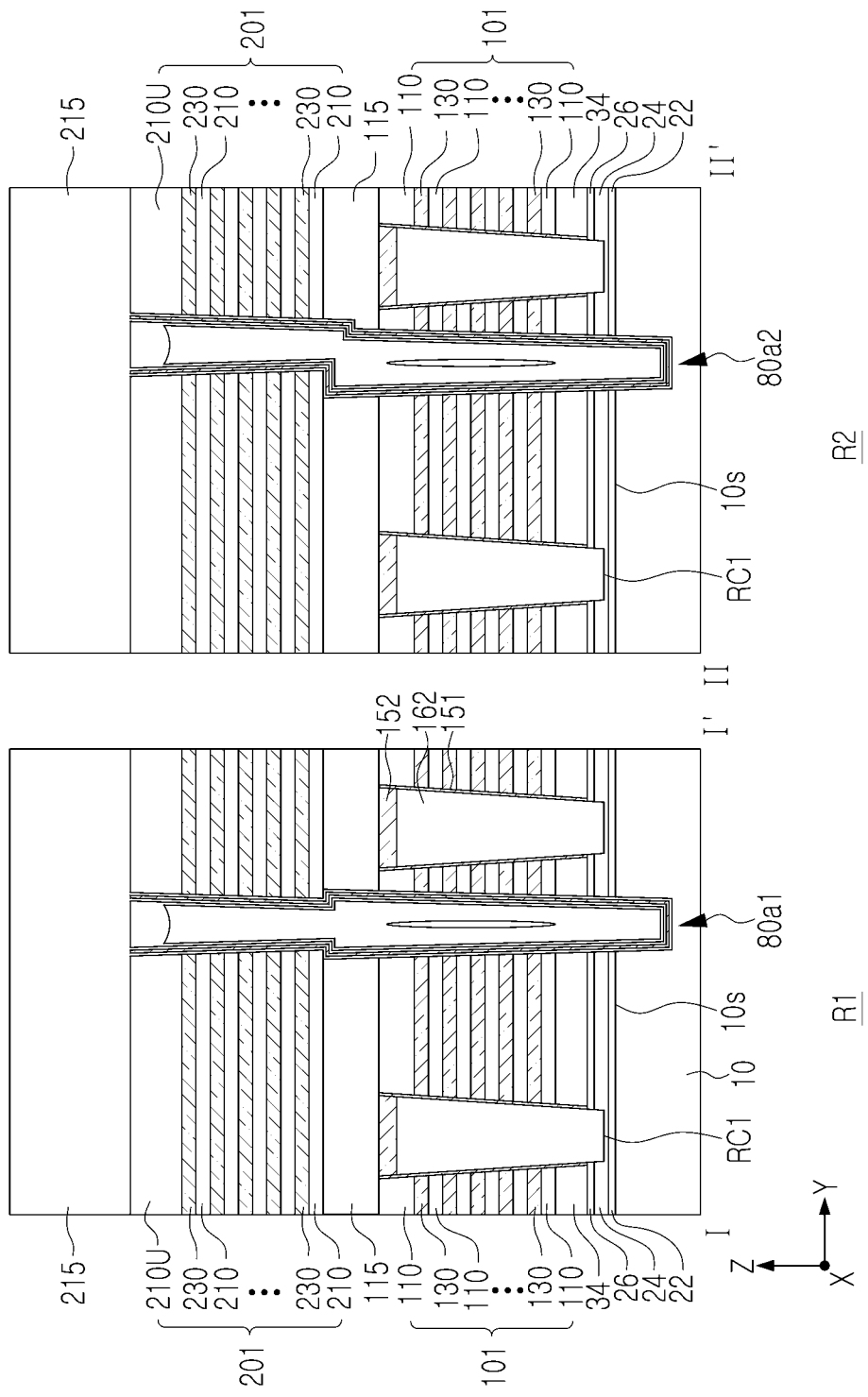

Referring to FIG. 10, the first preliminary vertical structure 61 filling the first vertical hole, the first vertical spacer 51, and the second vertical spacer 52 may be removed, and first and second vertical structures 80a1 and 80a2 may be formed. As previously described, the first and second vertical structures 80a1 and 80a2 may include a gap fill insulation pattern 81, a vertical channel pattern 82 on the gap fill insulation pattern 81, a tunnel insulation film 83 on the vertical channel pattern 82, a charge storage film 84 on the tunnel insulation film 83, a blocking insulation film 85 on the charge storage film 84, and a capping pattern 86 covering an upper surface of the gap fill insulation pattern 81. The blocking insulation film 85, the charge storage film 84, the tunnel insulation film 83, the vertical channel pattern 82, and the gap fill insulation pattern 81 may be inwardly formed from lateral surfaces of the vertical structures 80a1 and 80a2 in sequence.

An upper surface of the capping pattern 86 and an upper surface of a second uppermost interlayer insulating layer disposed in an uppermost position among the second interlayer insulating layers 210 may be substantially coplanar with each other.

An upper interlayer insulating layer 215 may be formed to cover the upper surface of the capping pattern 86 and the upper surface of the second uppermost interlayer insulating layer 210. For example, as shown in the exemplary embodiment of FIG. 14, the upper interlayer insulating layer 215 may be disposed directly on the second uppermost interlayer insulating layer 210U and the capping pattern 86 (e.g., in the Z direction). In an exemplary embodiment, the upper interlayer insulating layer 215 may include an insulating material such as silicon oxide. However, exemplary embodiments of the present inventive concepts are not limited thereto.

Figure 11:
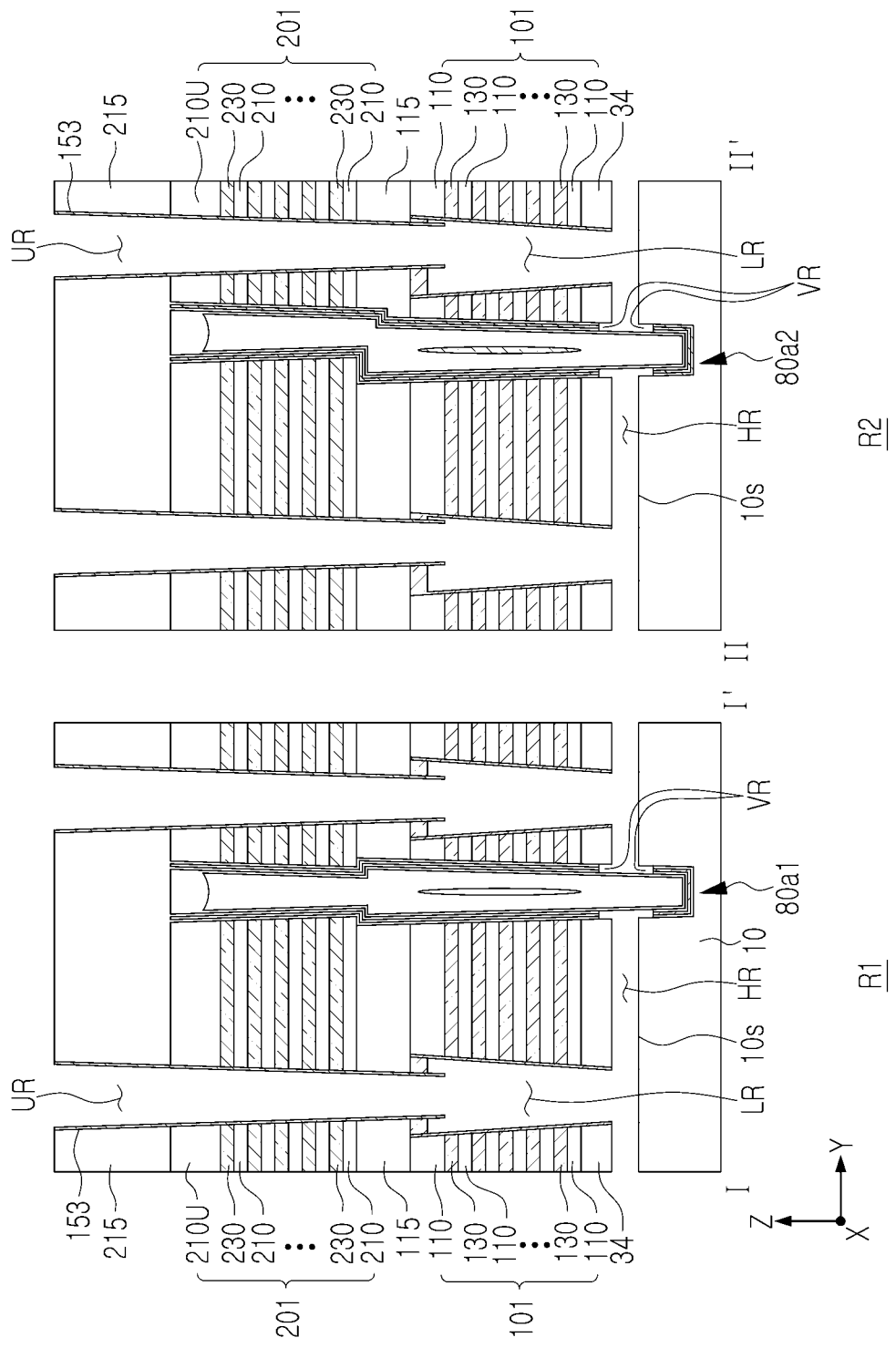

Referring to FIG. 11, a second trench may be formed to pass through the upper interlayer insulating layer 215, the second mold structure 201, the intermediate interlayer insulating layer 115, and the capping separation spacer 152. The second trench may have a width (e.g., length in the Y direction) that decreases towards the upper surface 10s of the substrate. A second separation spacer 153 may be formed to cover lateral surfaces of the second trench.

An upper region UR of the second trench may expose the first preliminary separation structure 162. The first preliminary separation structure 162 may be removed by the upper region UR of the second trench, to form a lower region LR of the second trench.

As shown in the exemplary embodiment of FIG. 11, after the first preliminary separation structure 162 is removed, the second horizontal insulating layer 26, the first preliminary horizontal connection pattern 24, and the first horizontal insulating layer 22 may be removed to form a horizontal region HR. Portions of the blocking insulation film 85, the charge storage film 84, and the tunnel insulation film 83 of the vertical structures 80a1 and 80a2 may be removed during the operation of forming the horizontal region HR, to form a vertical region VR including a portion extending between the second horizontal connection pattern 34 and the vertical channel pattern 82 and a portion extending between the substrate 10 and the vertical channel pattern 82.

The upper surface 10s of the substrate 10 may be exposed through the horizontal region HR, and the lateral surface of the vertical channel pattern 82 may be exposed through the vertical region VR.

Figure 12:
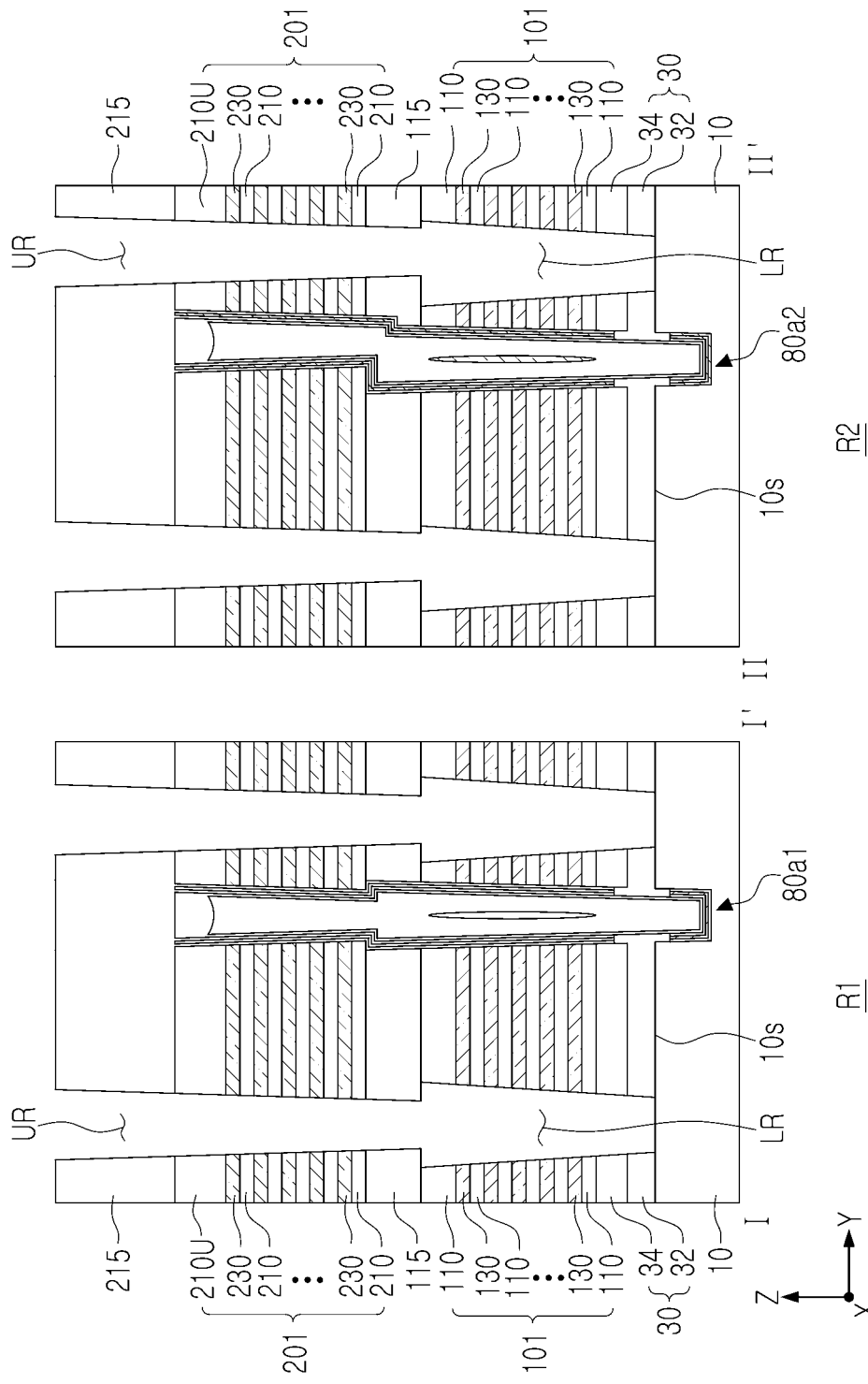

Referring to FIG. 12, a first horizontal connection layer filling the horizontal region HR and the vertical region VR may be formed. A lower surface of the first horizontal connection layer may contact the substrate, and an upper surface of the first horizontal connection layer may contact the second horizontal connection pattern.

A portion of the first horizontal connection layer exposed through the upper region UR and the lower region LR of the second trench may be removed to form a first horizontal connection pattern 32.

The first separation spacer 151 and the second separation spacer 153 may then be removed.

Figure 13:
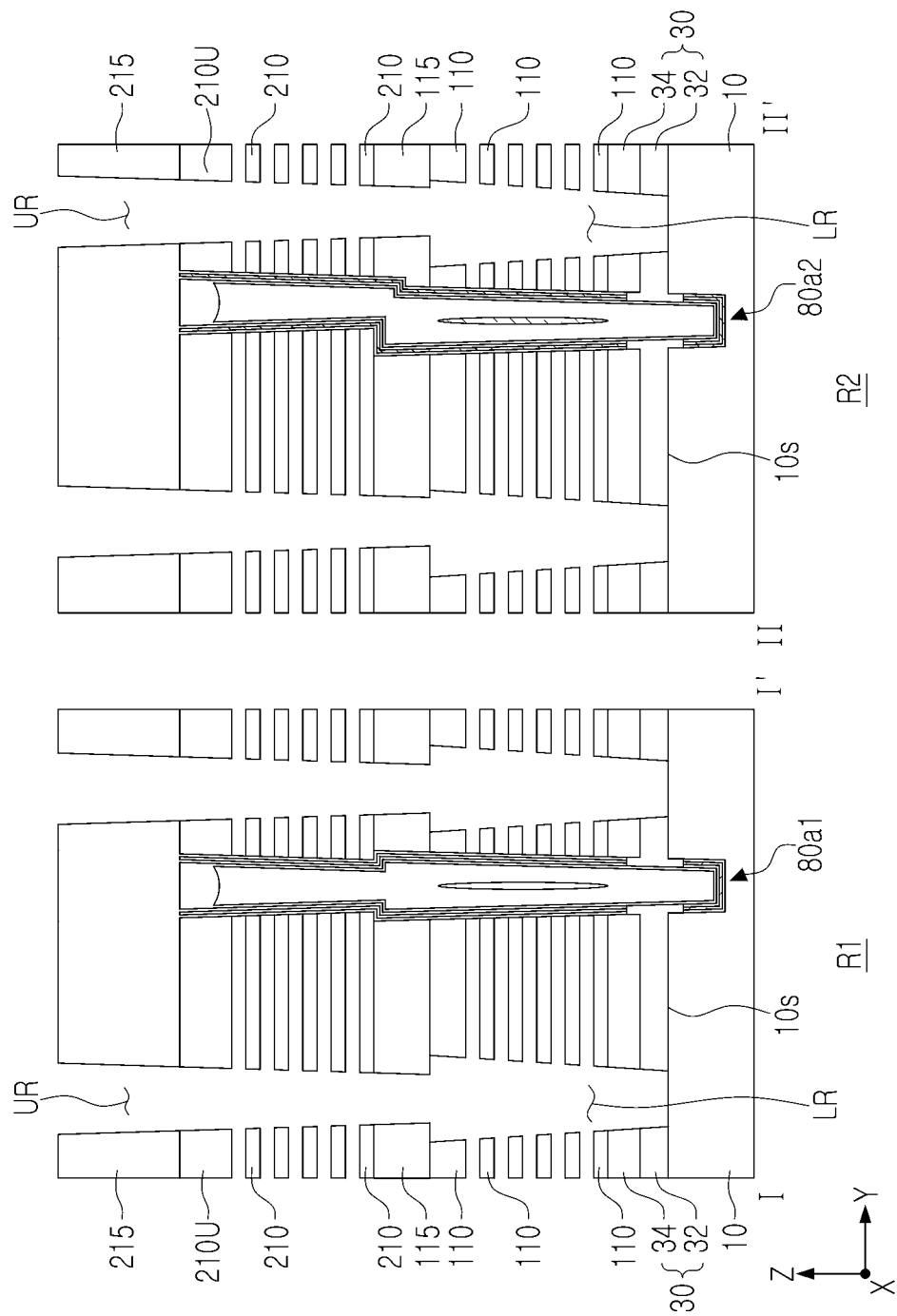

Referring to FIG. 13, the first preliminary gate layers 130 and the second preliminary gate layers 230, exposed through the upper region UR and the lower region LR, may be removed to form first void spaces and second void spaces.

Figure 14:
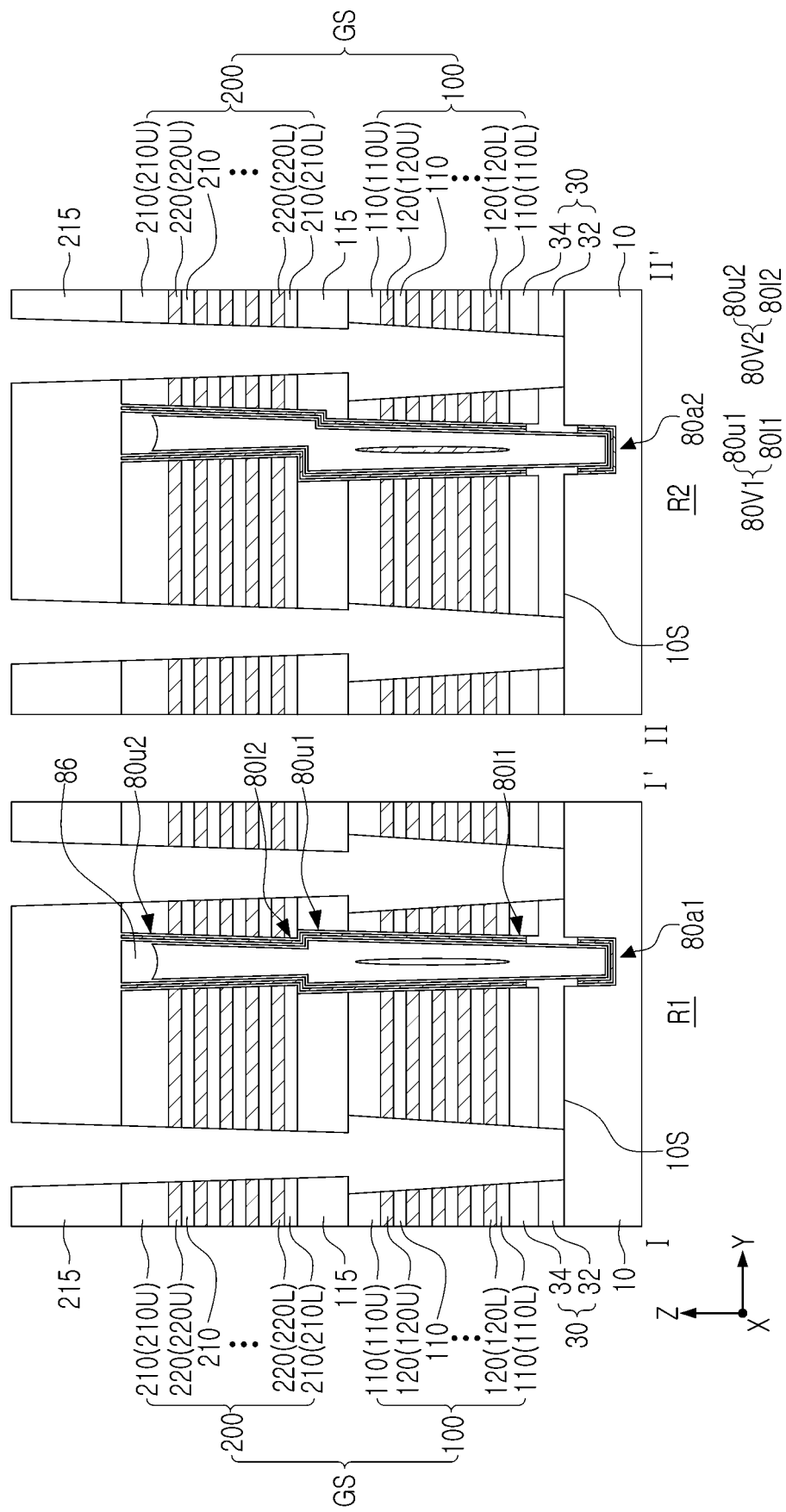

Referring to FIG. 14, first gate layers 120 filling the first void spaces formed by removing the first preliminary gate layers 130, and second gate layers 220 filling the second void spaces by removing the second preliminary gate layers 230 may be formed. For example, in an exemplary embodiment, the first gate layers 120 and the second gate layers 220 may be formed at the same time.

Referring next to FIG. 2A, the upper region UR and the lower region LR may be filled to form the separation structures 180. The capping layer 232 covering the upper surface of the separation structure 180 and the upper interlayer insulating layer 215 may be formed. The contact plug 235 may be formed to pass through the capping layer 232 and the upper interlayer insulating layer 215 and to contact the capping pattern 86 of the vertical structure 80. The conductive lines 240 may be formed to contact the contact plugs 235 and to be disposed on the capping layer 232. In an exemplary embodiment, the conductive lines 240 may include at least one metallic material selected from tungsten (W), aluminum (Al), copper (Cu), tungsten nitride (WN), tantalum nitride (TaN), titanium nitride (TiN), or combinations thereof. However, exemplary embodiments of the present inventive concepts are not limited thereto.

According to exemplary embodiments of the present inventive concepts, a method of manufacturing a semiconductor device is provided in which a trench forming operation for separating gate layers from multiple stacks of semiconductor devices precedes a channel hole forming operation. This operation sequence prevents a defect between the separation structure and the vertical structure from occurring even if the distance between the separation structure and the vertical structure may be reduced. Therefore, the method provides a semiconductor device with improved integration degree and reliability.

While exemplary embodiments of the present inventive concepts have been illustrated and described above, it will be apparent to those skilled in the art that modifications and variations could be made without departing from the scope of the present inventive concepts as defined by the appended claims.

The invention claimed is:

1. A semiconductor device comprising:
a first stack group comprising first interlayer insulating layers and first gate layers, alternately and repeatedly stacked on a substrate;
a second stack group comprising second interlayer insulating layers and second gate layers, alternately and repeatedly stacked on the first stack group;
an intermediate interlayer insulating layer disposed between the first stack group and the second stack group,
separation structures passing through the first and second stack groups and the intermediate interlayer insulating layer, and spaced apart from each other in a first direction that is parallel to an upper surface of the substrate, each of the separation structures including a first separation region and a second separation region disposed on the first separation region in a second direction that is a thickness direction of the substrate;
a vertical structure passing through the first and second stack groups as well as the intermediate interlayer insulating layer, and disposed between the separation structures in the first direction, the vertical structure including a first vertical region and a second vertical region disposed on the first vertical region in the second direction; and
a conductive line electrically connected to the vertical structure on the second stack group,
wherein the first vertical region comprises a first upper vertical region adjacent to the second vertical region and a first lower vertical region adjacent to the substrate,
wherein the second vertical region comprises a second lower vertical region adjacent to the first vertical region and having a width that is smaller than a width of the first upper vertical region, and a second upper vertical region adjacent to the conductive line,
wherein the first separation region comprises a first upper separation region adjacent to the second separation region, and a first lower separation region adjacent to the substrate,
wherein the second separation region comprises a second lower separation region adjacent to the first separation region and having a width that is smaller than a width of the first upper separation region, and a second upper separation region adjacent to the conductive line, wherein a distance between an upper end of the first vertical region and an upper surface of the substrate is greater than a distance between an upper end of the first separation region and an upper surface of the substrate, and wherein the upper end of the first separation region is in contact with a lower surface of the intermediate interlayer insulating layer.

2. The semiconductor device according to claim 1, wherein:

the vertical structure comprises a first bend portion, formed by a difference in the width of the first upper vertical region and the width of the second lower vertical region; and each of the separation structures comprises a second bend portion formed by a difference in the width of the first upper separation region and the width of the second lower separation region.

3. The semiconductor device according to claim 1, wherein:

a width of the first lower vertical region is smaller than the width of the first upper vertical region; and the width of the second lower vertical region is smaller than a width of the second upper vertical region.

4. The semiconductor device according to claim 1, wherein:

a width of the first lower separation region is smaller than die width of the first upper separation region, and the width of the second lower separation region is smaller than a width of the second upper separation region.

5. The semiconductor device according to claim 1, wherein each of the first and second separation regions and each of the first and second vertical regions comprise sloped lateral surfaces that are narrowed towards the substrate, and wherein a first imaginary line extending from the sloped lateral surface of the first separation region is shifted from a second imaginary line extending from the sloped lateral surface of the second separation region.

6. The semiconductor device according to claim 1, further comprising:

an upper interlayer insulating layer disposed on the second stack group, wherein the separation structures extend through the second stack group and the upper interlayer insulating layer in the second direction, and a length of the second separation region its the second direction is greater than a length of the second vertical region in the second direction.

7. The semiconductor device according to claim 1, wherein:

the first stack group comprises a first uppermost gate layer disposed in an uppermost position among the first gate layers, and the second stack group comprises a second lowermost gate layer disposed in a lowermost position among the second gate layers, wherein an upper end of the first lower vertical region is spaced apart from the first uppermost gate layer by a first distance, and an upper end of the first lower separation region is spaced from the first uppermost gate layer by a second distance that is less than the first distance.

8. The semiconductor device according to claim 1, wherein:

the vertical structure comprises a gap fill insulation pattern, a vertical channel pattern covering side and bottom surfaces of the gap fill insulation pattern, a tunnel insulation film covering side and bottom surfaces of the vertical channel pattern, a charge storage film covering side and bottom surfaces of the tunnel insulation film, and a blocking insulation film covering side and bottom surfaces of the charge storage film, wherein the blocking insulation film, the charge storage film, the tunnel insulation film, the vertical channel pattern, and the gap fill insulation pattern are inwardly arranged from a lateral surface of the vertical structure in sequence, and wherein the gap fill insulation pattern extends continuously from the first vertical region to the second vertical region.

9. The semiconductor device according to claim 8, further comprising:

a contact plug on the vertical structure, wherein the vertical structure further comprises a capping pattern covering an upper portion of the gap fill insulation pattern and connected to the vertical channel pattern, wherein the capping pattern includes doped polysilicon, and the contact plug is electrically connected to the capping pattern and the conductive line.

10. The semiconductor device according to claim 1, wherein a central portion of the first vertical region is aligned with a central portion of the second vertical region in the second direction.

11. The semiconductor device according to claim 1, further comprising:

a first horizontal connection pattern disposed between the substrate and the first stack group; and a second horizontal connection pattern disposed between, the first horizontal connection pattern and the first stack group, wherein the first and second horizontal connection patterns extend to the upper surface of the substrate in parallel and contact the vertical structure.

12. The semiconductor device according to claim 11, wherein the first horizontal connection pattern further comprises extension portions that contact the first lower vertical region and extend in the second direction.

13. The semiconductor device according to claim 1, further comprising a peripheral circuit region disposed below the substrate and comprising circuit elements.

14. A semiconductor device comprising:

a substrate;

first gate layers stacked on an upper surface of the substrate and spaced apart from each other in a first direction perpendicular to the upper surface of the substrate;

an intermediate interlayer insulating layer disposed on a first uppermost gate layer that is disposed in an uppermost position among the first gate layers;

second gate layers stacked on the intermediate interlayer insulating layer and spaced apart from each other in the first direction;

a vertical structure passing through the first gate layers, the intermediate interlayer insulating layer, and the second gate layers; and a separation structure passing through the first gate layers, the intermediate interlayer insulating layer, and the second gate layers, wherein the vertical structure has a first bend portion extending from a portion passing through the intermediate interlayer insulating layer to an upper surface of the intermediate interlayer insulating layer in a second direction, perpendicular to the first direction, and the separation structure has a second bend portion extending from a portion passing through the intermediate interlayer insulating layer to a lower surface of the intermediate interlayer insulating layer in the second direction, and wherein an upper end of the second bend portion is in contact with the lower surface of the intermediate interlayer insulating layer.

15. The semiconductor device according to claim 14, wherein:

the first bend portion is disposed at a same height as the upper surface of the intermediate interlayer insulating layer; and the second bend portion is disposed at the same height as the lower surface of the intermediate interlayer insulating layer.

16. The semiconductor device according to claim 14, wherein the first bend portion contacts a second lowermost interlayer insulating layer that is disposed on a top surface of the intermediate interlayer insulating layer.

17. The semiconductor device according to claim 14, wherein the second bend portion is disposed below the first bend portion by a first gap.

18. A semiconductor device comprising:

a substrate;

a first stack group comprising first interlayer insulating layers and first gate layers, alternately and repeatedly stacked on the substrate, the first stack group including a first uppermost interlayer insulating layer that is disposed in an uppermost position among the first interlayer insulating layers;

a second stack group comprising second interlayer insulating layers and second gate layers, alternately and repeatedly stacked on the first stack group, the second stack group including a second lowermost interlayer insulating layer that is disposed in a lowermost position among the second interlayer insulating layers;

a vertical structure passing through the first and second stack groups in a first direction that is perpendicular to an upper surface of the substrate; and separation structures passing through the first and second stack groups in the first direction, wherein the vertical structure has a first lower bend portion adjacent to the first uppermost interlayer insulating layer, and a first upper bend portion adjacent to the second lowermost interlayer insulating layer, the first lower bend portion is disposed on a level lower than a level of the first upper bend portion, based on the upper surface of the substrate, and the separation structures have a second bend portion adjacent to the first uppermost interlayer insulating layer, wherein the second bend portion is disposed on a level lower than both a level of the first lower bend portion and a level of the first upper bend portion based on the upper surface of the substrate.

19. The semiconductor device according to claim 18, wherein:

the vertical structure has a first lateral surface extending in the first direction from the first lower bend portion toward the first stack group, and a second lateral surface extending in the first direction from the first lower bend portion toward the second stack group, wherein the first lower bend portion extends from the first lateral surface toward the separation structure and is connected to the second lateral surface.

20. The semiconductor device according to claim 19, further comprising:

an intermediate interlayer insulating layer disposed between the first stack group and the second stack group, wherein an upper surface of the intermediate interlayer insulating layer is substantially coplanar with the first upper bend portion, and a lower surface of the intermediate interlayer insulating is substantially coplanar with the second bend portion.

* * * * *